(12) United States Patent
Zhang

(10) Patent No.: US 11,990,919 B2
(45) Date of Patent: May 21, 2024

(54) METHOD AND DEVICE IN UE AND BASE STATION FOR CHANNEL CODING

(71) Applicant: Xiaobo Zhang, Shanghai (CN)

(72) Inventor: Xiaobo Zhang, Shanghai (CN)

(73) Assignee: SHANGHAI LANGBO COMMUNICATION TECHNOLOGY COMPANY LIMITED, Shanghai (CN)

(*) Notice: Subject to any disclaimer, the term of this patent is extended or adjusted under 35 U.S.C. 154(b) by 0 days.

(21) Appl. No.: 18/225,689

(22) Filed: Jul. 25, 2023

(65) Prior Publication Data
US 2023/0370088 A1    Nov. 16, 2023

Related U.S. Application Data

(63) Continuation of application No. 18/091,459, filed on Dec. 30, 2022, now Pat. No. 11,750,215, which is a
(Continued)

(30) Foreign Application Priority Data

Dec. 28, 2016 (CN) .......................... 201611235136.6

(51) Int. Cl.
*H03M 13/09* (2006.01)
*A01D 34/00* (2006.01)
(Continued)

(52) U.S. Cl.
CPC .......... *H03M 13/09* (2013.01); *A01D 34/008* (2013.01); *G05D 1/0214* (2013.01);
(Continued)

(58) Field of Classification Search
CPC ......... H03M 13/09; H03M 13/13; H04L 1/00; H04L 1/0009; H04L 1/0014; H04L 1/0052; H04L 1/0057; H04L 1/0061; H04L 1/007
(Continued)

(56) References Cited

U.S. PATENT DOCUMENTS

| | | | | |
|---|---|---|---|---|
| 7,797,604 B2* | 9/2010 | Lee | ........................ | H04L 1/1819 714/748 |
| 2006/0161642 A1* | 7/2006 | Bopardikar | ............. | H04L 12/54 709/219 |

(Continued)

FOREIGN PATENT DOCUMENTS

| | | |
|---|---|---|
| CN | 102164025 A | 6/2013 |
| CN | 105227189 A | 1/2016 |

(Continued)

OTHER PUBLICATIONS

Majdolashrafi et al., A Concatenated Scheme to Improve the Performance of Polar Codes on Symmetric Memoryless Channels, May 20-22, 2014, IEEE, pp. 1827-1831. (Year: 2014).*
Wang et al., Joint Source-Channel Decoding of Polar Codes for Language-Based Sources, 2016, IEEE, pp. 1-6. (Year: 2016).*
Song Wenqing et al: "Low-complexity 1-15 segmented CRC-aided SC stack decoder forpolar codes",2016 50TH Asllomar Conference on Signals ,Systems and Computers , 1EEE,Nov. 6, 2016 (Nov. 6, 2016), pp. 1189-1193 , XP033072790.
(Continued)

*Primary Examiner* — John J Tabone, Jr.

(57) ABSTRACT

The disclosure discloses a method and device in UE and a base station for channel coding. A first node first determines a first bit block and then transmits a first radio signal, wherein bits of the first bit block are used to generate bits of a second bit block, a third bit block comprises bits of the second bit block and the first bit block, and the third bit block is used to generate the first radio signal. The first bit block, the second bit block and the third bit block comprise P1, P2 and P3 bits, respectively.

20 Claims, 11 Drawing Sheets

Related U.S. Application Data continuation of application No. 17/558,625, filed on Dec. 22, 2021, now Pat. No. 11,575,388, which is a continuation of application No. 17/105,659, filed on Nov. 27, 2020, now Pat. No. 11,245,417, which is a continuation of application No. 16/449,483, filed on Jun. 24, 2019, now Pat. No. 10,931,306, which is a continuation of application No. PCT/CN2017/098454, filed on Aug. 22, 2017.

(51) Int. Cl.
  *G05D 1/00*     (2006.01)
  *H03M 13/13*    (2006.01)
  *H04L 1/00*     (2006.01)
  *A01D 101/00*   (2006.01)

(52) U.S. Cl.
  CPC ......... *G05D 1/0219* (2013.01); *G05D 1/0225* (2013.01); *H03M 13/13* (2013.01); *H04L 1/00* (2013.01); *H04L 1/0009* (2013.01); *H04L 1/0014* (2013.01); *H04L 1/0052* (2013.01); *H04L 1/0057* (2013.01); *H04L 1/0061* (2013.01); *H04L 1/007* (2013.01); *A01D 2101/00* (2013.01)

(58) Field of Classification Search
  USPC .................. 714/748, 755, 756, 786, 821
  See application file for complete search history.

(56) References Cited

U.S. PATENT DOCUMENTS

| | | | |
|---|---|---|---|
| 2009/0052656 A1* | 2/2009 | Mantin | H04L 9/0625 380/28 |
| 2009/0175293 A1 | 7/2009 | Xia | |
| 2016/0079999 A1 | 3/2016 | Shen | |
| 2016/0182187 A1 | 6/2016 | Kim | |
| 2019/0334655 A1* | 10/2019 | Zhang | H04L 1/0061 |

FOREIGN PATENT DOCUMENTS

| | | | |
|---|---|---|---|
| CN | 105680883 A | 6/2016 | |
| EP | 2802080 A1 | 11/2014 | |
| JP | 2019522399 A | 8/2019 | |
| WO | 03030541 A3 | 10/2003 | |

OTHER PUBLICATIONS

Ido Tal and Alexander Vardy, List Decoding of Polar Codes, IEEE Transactions on Information Theory, Mar. 5, 2015, vol. 61, No. 5, pp. 2213-2222.
InterDigital Communications, Interleaver for Polar Codes[online], 3GPP TSG RAN WG1 Meeting #86bis R1-1609899, Oct. 1, 2016.
Qualcomm Incorporated, Control channel performance[online], 3GPP TSG RAN WG1 #87 R1-1613085, Nov. 19, 2016.
Huawei et al 吖"Details of the Polar Code Design", 3GPP TSG RAN WG 1 Meeting #87, RI-1611254, Nov. 10, 2016 (Nov. 10, 2016), entire document.
Huawei et al 吖"Evaluation of Polar Codes for eMBB Scenario", 3GPP TSG RAN WG 1 Meeting #85, RI-164375, May 23, 2016 (May 23, 2016), entire document.
ISR received in application No. PCT/CN2017/098454 dated Oct. 26, 2017.
JP2019-556398 First Search Report dated Dec. 8, 2020.
EP17888656.0 First Search Report dated Nov. 21, 2019.
KR1020197022164 First Search Report dated 1Mar. 24, 2020.
KR10-2021-7001231 First Search Report dated Mar. 17, 2021.
CN201611235136.6 First Office Action dated Sep. 18, 2018.
CN201611235136.6 Second Office Action dated Oct. 26, 2018.
CN201611235136.6 Third Office Action dated Nov. 14, 2018.
CN201611235136.6 First Search Report dated Sep. 10, 2018.
CN201611235136.6 Notification to Grant Patent Right for Invention dated Dec. 6, 2018.
CN201811278151.8 First Office Action dated Sep. 24, 2020.
CN201811278151.8 Second Office Action dated Nov. 2, 2020.
CN201811278151.8 Notification to Grant Patent Right for Invention dated Nov. 30, 2020.
CN201811278154.1 First Office Action dated Sep. 27, 2020.
CN201811278154.1 Second Office Action dated Nov. 2, 2020.
CN201811278154.1 Notification to Grant Patent Right for Invention dated Nov. 30, 2020.
JP2021-159041 First Search Report dated Oct. 28, 2022.
Huawei, HiSilicon Polar Code Construction for NR 3GPP TSG RAN WG1 Meeting #86bis R1-1608862 Oct. 1, 2016.
EP17888656.0 Office Action dated Oct. 8, 2021.
CN201811278151.8 First Search dated Sep. 16, 2020.
CN201811278154.1 First Search dated Sep. 17, 2020.

* cited by examiner

METHOD AND DEVICE IN UE AND BASE STATION FOR CHANNEL CODING

CROSS-REFERENCE TO RELATED APPLICATION

This application is a continuation of the U.S. patent application Ser. No. 18/091,459, filed on Dec. 30, 2022, which is a continuation of the U.S. application Ser. No. 17/558,625, filed on Dec. 22, 2021; which is a continuation of the U.S. application Ser. No. 17/105,659, filed on Nov. 27, 2020; which is a continuation of the U.S. application Ser. No. 16/449,483, filed Jun. 24, 2019; which is a continuation of International Application No. PCT/CN2017/098454, filed Aug. 22, 2017; claiming the priority benefit of Chinese Patent Application Serial Number 201611235136.6, filed on Dec. 28, 2016, the full disclosure of which is incorporated herein by reference.

BACKGROUND

Technical Field

The disclosure relates to a method for transmitting radio signals in a wireless communication system, and in particular to a method and device used for transmitting channel coding.

RELATED ART

Polar Codes are coding schemes first proposed by Professor Erdal Arikan from University of Birken in Turkey in 2008, which may realize the code construction method of the capacity of a symmetrical Binary input Distributed Memoryless Channel (B-DMC). At the 3rd Generation Partner Project (3GPP) RAN1 #87 conference, the 3GPP determined the use of a Polar code scheme as a control channel coding scheme of the 5G Enhanced Mobile Broadband (eMBB) scenario.

The simulation of 3GPP document R1-164356 proves that when the number of information bits is low, a polar code adopts a Cyclic Redundancy Check (CRC) bit, which will result in a decrease in transmission efficiency, i.e., lower than Tail-Biting Convolutional Codes (TBCC). R1-164356 further proposes a scheme in which the polar code does not adopt CRC.

In the traditional Long Term Evolution (LTE) system, the CRC plays a specific function such as error check and target receiver identification. Therefore, simply canceling the CRC in the polar code will make the above specific functions impossible.

SUMMARY

In view of the above problem, the disclosure provides a solution. It should be noted that, in the case of no conflict, the embodiments of the disclosure and the features in the embodiments may be combined with each other arbitrarily. For example, embodiments in the first node of the disclosure and the features in the embodiments may be applied to a second node, and vice versa.

The disclosure discloses a method in a first node for wireless communication, comprising:
determining a first bit block;
transmitting a first radio signal;
wherein bits in the first bit block are used to generate bits in a second bit block, a third bit block comprises the bits in the second bit block and the bits in the first bit block, the third bit block is used to generate the first radio signal; the first bit block and the second bit block comprise P1 second-type bits and P2 first-type bits, respectively, the third bit block comprise P3 binary bits, any one of {the P1 second-type bits, the P2 first-type bits} is a binary bit, and the P1, the P2 and the P3 are positive integers, respectively; a position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, and the reference second-type bit is one of the P1 second-type bits. A CRC bit block of the first bit block is used to generate the second bit block; at least two second-type bits of the P1 second-type bits have front and rear positions in the first bit block opposite to front and rear positions in the third bit block.

In one embodiment, the above method has the advantage that the position of a first-type bit in the third bit block can be adjusted according to the number of bits in the first bit block associated with the first-type bit, first-type bits associated with different numbers of bits are mapped onto sub-channels having different reliabilities, and unequal error protection is implemented for first-type bits having different importance.

In one embodiment, the above method has the advantage that the position of a second-type bit in the third bit block can be adjusted according to the positions of bits in the second bit block associated with the second-type bit in the third bit block, so as to improve decoding accuracy and simplify decoding using the correlation between the second-type bit and some bits in the second bit block in the decoding process of the third bit block.

In one embodiment, the first bit block is generated on a physical layer of the first node.

In one embodiment, the first node is a base station, and the first node generates the first bit block according to a scheduling result.

In one embodiment, the first node is a User Equipment (UE), and the first node generates the first bit block according to a scheduling of a base station.

In one embodiment, for an arbitrary bit of the second bit block, the arbitrary bit is equal to a sum of a positive integer number of bits in the first bit block modulo 2.

In one embodiment, for an arbitrary bit of the second bit block, the arbitrary bit is obtained by performing XOR operation between a sum of a positive integer number of bits in the first bit block modulo 2 and a corresponding bit in a scrambling sequence.

In one embodiment, for an arbitrary bit of the first bit block, the arbitrary bit is used to determine at least one bit in the second bit block.

In one embodiment, the first bit block is independent of bits outside the second bit block.

In one embodiment, the P3 is equal to a sum of the P1 and the P2, and the third bit block consists of all bits in the second bit block and all bits in the first bit block.

In one embodiment, the P3 is equal to the P1 plus the P2 plus P4, the P4 is the number of bits included in the fourth bit block, and the P4 is a positive integer. The third bit block consists of {all bits in the second bit block, all bits in the first bit block, all bits in the fourth bit block}. The values of all bits in the fourth bit block are preset.

In one sub-embodiment of the above embodiment, all bits in the fourth bit block are 0.

In one embodiment, the bits in the second bit block are continuous in the third bit block.

In one embodiment, at least two bits of the second bit block are discontinuous in the third bit block, and at least two bits of the first bit block are discontinuous in the third bit block.

In one embodiment, the first radio signal is transmitted on a physical layer control channel (i.e., a physical layer channel that cannot be used to transmit physical layer data).

In one embodiment, the first radio signal is transmitted on a physical layer data channel (i.e., a physical layer channel that can be used to carry physical layer data).

In one embodiment, the first node is a UE.

In one sub-embodiment of the above embodiment, the first radio signal is transmitted on a Physical Uplink Control Channel (PUCCH).

In one sub-embodiment of the above embodiment, the first radio signal is transmitted on a Physical Uplink Shared Channel (PUSCH).

In one embodiment, the first node is a base station.

In one sub-embodiment of the above embodiment, the first radio signal is transmitted on a Physical Downlink Shared Channel (PDSCH).

In one sub-embodiment of the above embodiment, the first radio signal is transmitted on a Physical Downlink Control Channel (PDCCH).

In one embodiment, the first radio signal is an output after the third bit block is sequentially subjected to channel coding, scrambling, a modulation mapper, a layer mapper, precoding, a resource element mapper, and wideband symbol generation.

In one embodiment, the first radio signal is an output after the third bit block is sequentially subjected to channel coding, scrambling, a modulation mapper, a layer mapper, a transform precoder (to generate a complex value signal), precoding, a resource element mapper, and wideband symbol generation.

Specifically, according to an aspect of the disclosure, the bits in the second bit block are sequentially arranged in the third bit block according to numbers of associated bits in the first bit block.

In one embodiment, a position of a third bit in the third bit block is prior to a position of a fourth bit in the third bit block, the third bit and the fourth bit are any two bits in the second bit block, and a number of bits in the first bit block associated with the third bit is less than a number of bits in the first bit block associated with the fourth bit.

In one sub-embodiment of the above embodiment, an index of the third bit in the third bit block is smaller than an index of the fourth bit in the third bit block.

Specifically, according to an aspect of the disclosure, all of second-type bits associated with a given first-type bit are arranged prior to the given first-type bit in the third bit block, and the given first-type bit is one of the P2 first-type bits.

In one embodiment, an index of all of the second-type bits associated with the given first-type bit in the third block is smaller than an index of the given first-type bit in the third block.

Specifically, according to an aspect of the disclosure, among first-type bits associated with a first target bit and independent of a second target bit, a first bit is arranged foremost in the third bit block, among first-type bits associated with the second target bit and independent of the first target bit, a second bit is arranged foremost in the third bit block; the first bit is prior to the second bit, a position of the first target bit in the third bit block is prior to a position of the second target bit in the third bit block; and the first target bit and the second target bit are any two of the P1 second-type bits.

In one embodiment, an index of the first bit in the third bit block is the smallest in first-type indexes, the first-type indexes are indexes of the first-type bits associated with the first target bit and independent of the second target bit in the third bit block.

In one embodiment, an index of the second bit in the third bit block is the smallest in second-type indexes, the second-type indexes are indexes of the first-type bits associated with the second target bit and independent of the first target bit in the third bit block.

In one embodiment, an index of the first target bit in the third bit block is smaller than an index of the second target bit in the third bit block.

In one embodiment, an index of the first bit in the third bit block is smaller than an index of the second bit in the third bit block.

Specifically, according to an aspect of the disclosure, the method comprises:

performing channel coding;

wherein the third bit block is used as an input to the channel coding, an output of the channel coding is used to generate the first radio signal, the channel coding is based on a polar code; any two bits in the third bit block are mapped onto two different sub-channels, respectively; and a channel capacity of a sub-channel mapped by any one bit of a first bit set is larger than a channel capacity of a sub-channel mapped by any one bit of a second bit set.

In one embodiment, the P2 first-type bits belong to the first bit set, and the P1 second-type bits belong to the second bit set.

In one embodiment, the P2 first-type bits belong to the second bit set, and the P1 second-type bits belong to the first bit set.

In one embodiment, a part of the P2 first-type bits belongs to the first bit set, and another part of the P2 first-type bits belongs to the second bit set.

In one embodiment, the above method has the advantage that unequal error protection for the first bit set and the second bit set can be implemented, so that important bits are transmitted on sub-channels with high reliability, improving the transmission quality of the first radio signal.

In one embodiment, there is no common bit in the first bit set and the second bit set.

In one embodiment, any bit in the third bit block belongs to one of {the first bit set, the second bit set}.

In one embodiment, the part of the P2 first-type bits belongs to the first bit set, and the other part of the P2 first-type bits and the P1 second-type bits belong to the second bit set.

In one embodiment, the part of the P2 first-type bits and the P1 second-type bits belong to the first bit set, and the other part of the P2 first-type bits belongs to the second bit set.

In one embodiment, bits in the third bit block are sequentially mapped according to channel capacities of sub-channels.

In one embodiment, bits in the third bit block are sequentially mapped according to indexes of sub-channels.

In one sub-embodiment of the above embodiment, a fifth bit is any bit in the third bit block, an index of the fifth bit in the third bit block is p, and the p is an integer greater than or equal to 0 and less than the P3. The fifth bit is mapped to a fifth sub-channel, and an index of the fifth sub-channel on all sub-channels is the p.

In one embodiment, the part of the P2 first-type bits is continuous in the third bit block, and the other part of the P2 first-type bits is discontinuous in the third bit block.

In one embodiment, the part of the P2 first-type bits is discontinuous in the third bit block, and the other part of the P2 first-type bits is continuous in the third bit block.

In one embodiment, the part of the P2 first-type bits and the other part of the P2 first-type bits constitute the second bit block.

In one embodiment, the part of the P2 first-type bits comprises P2/2 bit(s) in the second bit block, and the other part of the P2 first-type bits comprises P2/2 bit(s) in the second bit block.

In one embodiment, any two different sub-channels have different channel capacities.

In one embodiment, the first radio signal is obtained after the output of the channel coding is sequentially subjected to scrambling, a modulation mapper, a layer mapper, precoding, a resource element mapper, and wideband symbol generation.

In one embodiment, the first radio signal is obtained after the output of the channel coding is sequentially subjected to scrambling, a modulation mapper, a layer mapper, a transform precoder (to generate a complex value signal), precoding, a resource element mapper, and wideband symbol generation.

Specifically, according to an aspect of the disclosure, the CRC bit block of the first bit block is used to generate the second bit block.

In one embodiment, the second bit block is the CRC bit block of the first bit block.

In one embodiment, the second bit block is a bit block after the CRC bit block of the first bit block is subjected to scrambling.

In one embodiment, a scrambling sequence adopted by the scrambling is related to an identifier of the first node.

In one embodiment, the first node is a UE, and the identifier of the first node is a Radio Network Temporary Identifier (RNTI).

In one embodiment, the first node is a base station, and the identifier of the first node is a Physical Cell Identifier (PCI).

In one embodiment, a scrambling sequence adopted by the scrambling is related to an identifier of a target receiver of the first radio signal.

In an embodiment, the first node is a base station, and the identifier of the target receiver of the first radio signal is an RNTI.

In one embodiment, the CRC bit block of the first bit block is an output of the first bit block subjected to a CRC cyclic generator polynomial. The polynomial formed by the first bit block and the CRC bit block of the first bit block is divisible by the CRC cyclic generator polynomial on GF(2). That is to say, a remainder obtained by the polynomial formed by the first bit block and the CRC bit block of the first bit block divided by the CRC cycle generator polynomial is zero.

In one embodiment, the P2 is one of {24, 16, 8}.

Specifically, according to an aspect of the disclosure, the first node is a base station, the first bit block comprises downlink control information; or the first node is a UE, and the first bit block comprises uplink control information.

In one embodiment, the downlink control information indicates at least one of {occupied time domain resources, occupied frequency domain resources, a Modulation and Coding Scheme (MCS), a Redundancy Version (RV), a New Data Indicator (NDI), a Hybrid Automatic Repeat reQuest (HARD) process number} of a corresponding data.

In one embodiment, the uplink control information indicates at least one of {HARQ-ACK (Acknowledgement), Channel State Information (CSI), Scheduling Request (SR), CRI}.

The disclosure discloses a method in a second node for wireless communication, comprising:
receiving a first radio signal;
recovering a first bit block;
wherein bits in the first bit block are used to generate bits in a second bit block, a third bit block comprises the bits in the second bit block and the bits in the first bit block, the third bit block is used to generate the first radio signal; the first bit block and the second bit block comprise P1 second-type bits and P2 first-type bits, respectively, the third bit block comprise P3 binary bits, any one of {the P1 second-type bits, the P2 first-type bits} is a binary bit, and the P1, the P2 and the P3 are positive integers, respectively; a position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, and the reference second-type bit is one of the P1 second-type bits. A CRC bit block of the first bit block is used to generate the second bit block; at least two second-type bits of the P1 second-type bits have front and rear positions in the first bit block opposite to front and rear positions in the third bit block.

In one embodiment, the second node is a base station, and the first node is a UE.

In one embodiment, the second node is a UE, and the first node is a base station.

Specifically, according to an aspect of the disclosure, the bits in the second bit block are sequentially arranged in the third bit block according to numbers of associated bits in the first bit block.

Specifically, according to an aspect of the disclosure, all of second-type bits associated with a given first-type bit are arranged prior to the given first-type bit in the third bit block.

Specifically, according to an aspect of the disclosure, among first-type bits associated with a first target bit and independent of a second target bit, a first bit is arranged foremost in the third bit block; among first-type bits associated with the second target bit and independent of the first target bit, a second bit is arranged foremost in the third bit block; the first bit is prior to the second bit, a position of the first target bit in the third bit block is prior to a position of the second target bit in the third bit block, and the first target bit and the second target bit are any two of the P1 second-type bits.

Specifically, according to an aspect of the disclosure, the method comprises:
performing channel decoding;
wherein the first radio signal is used to generate an input to the channel decoding, channel coding corresponding to the channel decoding is based on a polar code; the third bit block is used as an input to the channel coding; any two bits in the third bit block are mapped onto two different sub-channels, respectively; and a channel capacity of a sub-channel mapped by any one bit of a first bit set is larger than a channel capacity of a sub-channel mapped by any one bit of a second bit set.

In one embodiment, the P2 first-type bits belong to the first bit set, and the P1 second-type bits belong to the second bit set.

In one embodiment, the P2 first-type bits belong to the second bit set, and the P1 second-type bits belong to the first bit set.

In one embodiment, a part of the P2 first-type bits belongs to the first bit set, and another part of the P2 first-type bits belongs to the second bit set.

In one embodiment, the output of the channel decoding is used to recover the first bit block.

Specifically, according to an aspect of the disclosure, the channel decoding is used to determine P3 reference values, and the P3 reference values are respectively corresponding to P3 bits in the third bit block.

In one embodiment, a reference value corresponding to at least one of the P2 first-type bits is used for pruning in the channel decoding.

In one embodiment, a reference value corresponding to at least one of the P2 first-type bits is used to determine whether the first bit block is received correctly.

In one embodiment, the above method has the advantage that a part of the P2 first-type bits can be used to improve decoding accuracy and reduce decoding complexity in the channel decoding; another part of the P2 first-type bits may be used to implement the function of a conventional CRC, i.e. to determine whether the first bit block is received correctly, and to communicate the identifier of the first node, or to communicate the identifier of the target receiver of the first radio signal.

In one embodiment, the P3 reference values are respectively (received) bits recovered for corresponding (transmitted) bits.

In one embodiment, the P3 reference values are respectively (received) soft bits recovered for corresponding (transmitted) bits.

In one embodiment, the P3 reference values are respectively Log Likelihood Ratio (LLR) estimated for corresponding (transmitted) bits.

In one embodiment, the pruning is used to reduce surviving search paths in the channel decoding based on Viterbi criteria.

In one embodiment, for a given reference value used for pruning, positions of bits corresponding to a pruned search path in the third bit block are prior to a position of a given first-type bit in the third bit block. The given reference value is a reference value used for pruning in the P3 reference values, and the given first-type bit corresponds to the given reference value.

In one embodiment, reference values corresponding to the P2 first-type bits (i.e., all bits in the second bit block) are used for the pruning.

In one embodiment, reference values corresponding to the P2 first-type bits (i.e., all bits in the second bit block) are used to determine whether the first bit block is received correctly.

In one embodiment, reference values corresponding to all bits in the part of the P2 first-type bits are used for the pruning, and reference values corresponding to all bits in the other part of the P2 first-type bits are used to determine whether the first bit block is received correctly.

In one embodiment, reference values corresponding to all bits in the other part of the P2 first-type bits are used for the pruning, and reference values corresponding to all bits in the part of the P2 first-type bits are used to determine whether the first bit block is correctly recovered.

In one embodiment, first-type bits in the P2 first-type bits used to determine whether the first bit block is correctly recovered is further used to indicate the identifier of the target receiver of the first radio signal.

In one embodiment, first-type bits in the P2 first-type bits used to determine whether the first bit block is correctly recovered is further used to indicate the identifier of the first node.

In one embodiment, reference values corresponding to first-type bits in the P2 first-type bits used to determine whether the first bit block is correctly recovered and reference values corresponding to the first bit block pass through CRC check together, if the check result is correct, it is determined that the first bit block is correctly recovered; otherwise, it is determined that the first bit block is not correctly recovered.

Specifically, according to an aspect of the disclosure, the CRC bit block of the first bit block is used to generate the second bit block.

Specifically, according to an aspect of the disclosure, the second node is a base station, the first bit block comprises uplink control information, or the second node is a UE, and the first bit block comprises downlink control information.

The disclosure discloses a device in a first node for wireless communication, comprising:
 a first processor, to generate a first bit block;
 a first transmitter, to transmit a first radio signal;
 wherein bits in the first bit block are used to generate bits in a second bit block, a third bit block comprises the bits in the second bit block and the bits in the first bit block, the third bit block is used to generate the first radio signal; the first bit block and the second bit block comprise P1 second-type bits and P2 first-type bits, respectively, the third bit block comprise P3 binary bits, any one of {the P1 second-type bits or the P2 first-type bits} is a binary bit, and the P1, the P2 and the P3 are positive integers, respectively; a position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, and the reference second-type bit is one of the P1 second-type bits. A CRC bit block of the first bit block is used to generate the second bit block; at least two second-type bits of the P1 second-type bits have front and rear positions in the first bit block opposite to front and rear positions in the third bit block.

In one embodiment, the device in a first node for wireless communication is characterized in that the bits in the second bit block are sequentially arranged in the third bit block according to numbers of associated bits in the first bit block.

In one embodiment, the device in a first node for wireless communication is characterized in that all of second-type bits associated with a given first-type bit are arranged prior to the given first-type bit in the third bit block, and the given first-type bit is one of the P2 first-type bits.

In one embodiment, the device in a first node for wireless communication is characterized in that among first-type bits associated with a first target bit and independent of a second target bit, a first bit is arranged foremost in the third bit block, among first-type bits associated with the second target bit and independent of the first target bit, a second bit is arranged foremost in the third bit block, the first bit is prior to the second bit, a position of the first target bit in the third bit block is prior to a position of the second target bit in the third bit block, and the first target bit and the second target bit are any two of the P1 second-type bits.

In one embodiment, the device in a first node for wireless communication is characterized in that the CRC bit block of the first bit block is used to generate the second bit block.

In one embodiment, the device in a first node for wireless communication is characterized in that the device in the first node is a base station device, the first bit block comprises downlink control information; or the device in the first node is a UE, and the first bit block comprises uplink control information.

Specifically, according to an aspect of the disclosure, the first processor further performs channel coding; wherein the third bit block is used as an input to the channel coding, an output of the channel coding is used to generate the first radio signal, the channel coding is based on a polar code; any two bits in the third bit block are mapped onto two different sub-channels, respectively; and a channel capacity of a sub-channel mapped by any one bit of a first bit set is larger than a channel capacity of a sub-channel mapped by any one bit of a second bit set.

In one embodiment, the P2 first-type bits belong to the first bit set, and the P1 second-type bits belong to the second bit set.

In one embodiment, the P2 first-type bits belong to the second bit set, and the P1 second-type bits belong to the first bit set.

In one embodiment, a part of the P2 first-type bits belongs to the first bit set, and another part of the P2 first-type bits belongs to the second bit set.

The disclosure discloses a device in a second node for wireless communication, comprising:
  a first receiver, to receive a first radio signal;
  a second processor, to recover a first bit block;
  wherein bits in the first bit block are used to generate bits in a second bit block, a third bit block comprises the bits in the second bit block and the bits in the first bit block, the third bit block is used to generate the first radio signal; the first bit block and the second bit block comprise P1 second-type bits and P2 first-type bits, respectively, the third bit block comprise P3 binary bits, any one of {the P1 second-type bits, the P2 first-type bits} is a binary bit, and the P1, the P2 and the P3 are positive integers, respectively; a position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, the reference second-type bit is one of the P1 second-type bits; a CRC bit block of the first bit block is used to generate the second bit block; at least two second-type bits of the P1 second-type bits have front and rear positions in the first bit block opposite to front and rear positions in the third bit block.

In one embodiment, the device in the second node for wireless communication is characterized in that the bits in the second bit block are sequentially arranged in the third bit block according to numbers of associated bits in the first bit block.

In one embodiment, the device in the second node for wireless communication is characterized in that all of second-type bits associated with a given first-type bit are arranged prior to the given first-type bit in the third bit block, and the given first-type bit is one of the P2 first-type bits.

In one embodiment, the device in the second node for wireless communication is characterized in that among first-type bits associated with a first target bit and independent of a second target bit, a first bit is arranged foremost in the third bit block, among first-type bits associated with the second target bit and independent of the first target bit, a second bit is arranged foremost in the third bit block, the first bit is prior to the second bit, a position of the first target bit in the third bit block is prior to a position of the second target bit in the third bit block, and the first target bit and the second target bit are any two of the P1 second-type bits;

In one embodiment, the device in the second node for wireless communication is characterized in that the CRC bit block of the first bit block is used to generate the second bit block.

In one embodiment, the device in the second node for wireless communication is characterized in that the second node is a base station, the first bit block comprises uplink control information; or the second node is a UE, and the first bit block comprises downlink control information.

Specifically, according to an aspect of the disclosure, the second processor further performs channel decoding; wherein the first radio signal is used to generate an input to the channel decoding, channel coding corresponding to the channel decoding is based on a polar code, the third bit block is used as an input to the channel coding; any two bits in the third bit block are mapped onto two different sub-channels, respectively; and a channel capacity of a sub-channel mapped by any one bit of a first bit set is larger than a channel capacity of a sub-channel mapped by any one bit of a second bit set.

In one embodiment, the P2 first-type bits belong to the first bit set, and the P1 second-type bits belong to the second bit set.

In one embodiment, the P2 first-type bits belong to the second bit set, and the P1 second-type bits belong to the first bit set.

In one embodiment, a part of the P2 first-type bits belongs to the first bit set, and another part of the P2 first-type bits belongs to the second bit set.

In one embodiment, the device in the second node for wireless communication is characterized in that the channel decoding is used to determine P3 reference values, and the P3 reference values are respectively corresponding to P3 bits in the third bit block.

In one embodiment, a reference value corresponding to at least one of the P2 first-type bits is used for pruning in the channel decoding.

In one embodiment, a reference value corresponding to at least one of the P2 first-type bits is used to determine whether the first bit block is received correctly.

Compared with the traditional scheme, the disclosure has the advantages that:
  CRC is used as an outer code of the polar code, thereby improving the decoding accuracy of the polar code;
  by properly designing the positional relationship between a part of the CRC bits and the corresponding information bits on the polar code input sequence, the part of the CRC bits can be used to implement pruning in the polar decoding process, thereby reducing the decoding complexity;
  another part of the CRC is used to implement the functions of the traditional CRC, namely, error checking and target receiver identification; and bits of different importance, comprising CRC bits associated with different numbers of information bits, CRC bits for pruning, CRC bits for error checking and target receiver identification, and information bits, are mapped to the sub-channels with different channel capacities, thereby achieving unequal error protection, and improving the transmission quality.

BRIEF DESCRIPTION OF THE DRAWINGS

Other features, objects and advantages of the disclosure will become more apparent from the detailed description of non-restrictive embodiments taken in conjunction with the following drawings.

DESCRIPTION OF THE EMBODIMENTS

Embodiment 1

Figure 1:
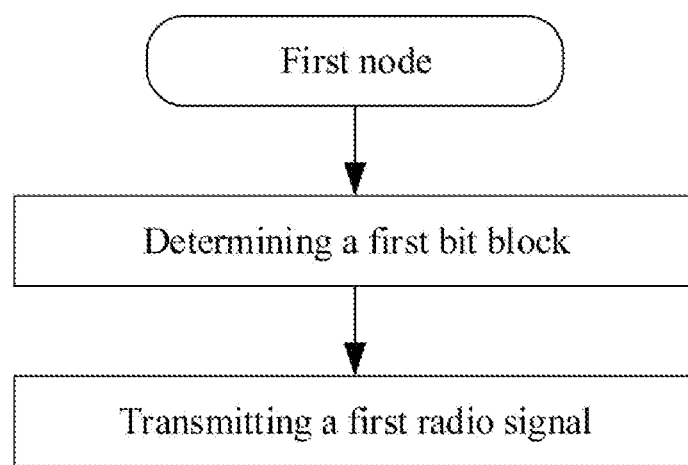
FIG. 1 is a flow chart illustrating a first bit block and a first radio signal according to an embodiment of the disclosure.

Embodiment 1 illustrates a flow chart of a first bit block and a first radio signal, as shown in FIG. 1.

In Embodiment 1, the first node in the disclosure first determines a first bit block; and then transmits a first radio signal, wherein bits in the first bit block are used to generate bits in a second bit block, a third bit block comprises the bits in the second bit block and the bits in the first bit block, the third bit block is used to generate the first radio signal; the first bit block and the second bit block comprise P1 second-type bits and P2 first-type bits, respectively, the third bit block comprise P3 binary bits, any one of {the P1 second-type bits, the P2 first-type bits} is a binary bit, and the P1, the P2 and the P3 are positive integers, respectively; a position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, and the reference second-type bit is one of the P1 second-type bits.

In one embodiment, the first bit block is generated on a physical layer of the first node.

In one embodiment, the first node is a base station, and the first node generates the first bit block according to a scheduling result.

In one embodiment, the first node is a User Equipment (UE), and the first node generates the first bit block according to a scheduling of the base station.

In one embodiment, for an arbitrary bit of the second bit block, the arbitrary bit is equal to a sum of a positive integer number of bits in the first bit block modulo 2.

In one embodiment, for an arbitrary bit of the second bit block, the arbitrary bit is obtained by performing XOR operation between a sum of a positive integer number of bits in the first bit block modulo 2 and a corresponding bit in a scrambling sequence.

In one embodiment, for an arbitrary bit of the first bit block, the arbitrary bit is used to determine at least one bit in the second bit block.

In one embodiment, the first bit block is independent of bits outside the second bit block.

In one embodiment, the P3 is equal to a sum of the P1 and the P2, and the third bit block consists of all bits in the second bit block and all bits in the first bit block.

In one embodiment, the P3 is equal to the P1 plus the P2 plus P4, the P4 is the number of bits included in the fourth bit block, and the P4 is a positive integer. The third bit block consists of {all bits in the second bit block, all bits in the first bit block, all bits in the fourth bit block}. The values of all bits in the fourth bit block are preset In one sub-embodiment of the above embodiment, all bits in the fourth bit block are 0.

In one embodiment, at least two bits of the second bit block are discontinuous in the third bit block, and at least two bits of the first bit block are discontinuous in the third bit block;

In one embodiment, the first radio signal is transmitted on a physical layer control channel (i.e., a physical layer channel that cannot be used to transmit physical layer data).

In one embodiment, the first radio signal is transmitted on a physical layer data channel (i.e., a physical layer channel that can be used to carry physical layer data).

In one embodiment, the first node is a UE.

In one sub-embodiment of the above embodiment, the first radio signal is transmitted on a PUCCH.

In one sub-embodiment of the above embodiment, the first radio signal is transmitted on a PUSCH.

In one embodiment, the first node is a base station.

In one sub-embodiment of the above embodiment, the first radio signal is transmitted on a PDSCH.

In one sub-embodiment of the above embodiment, the first radio signal is transmitted on a PDCCH.

In one embodiment, the first radio signal is an output after the third bit block is sequentially subjected to channel coding, scrambling, a modulation mapper, a layer mapper, precoding, a resource element mapper, and wideband symbol generation.

In one embodiment, the first radio signal is an output after the third bit block is sequentially subjected to channel coding, scrambling, a modulation mapper, a layer mapper, a transform precoder (to generate a complex value signal), precoding, a resource element mapper, and wideband symbol generation.

Embodiment 2

Figure 2:
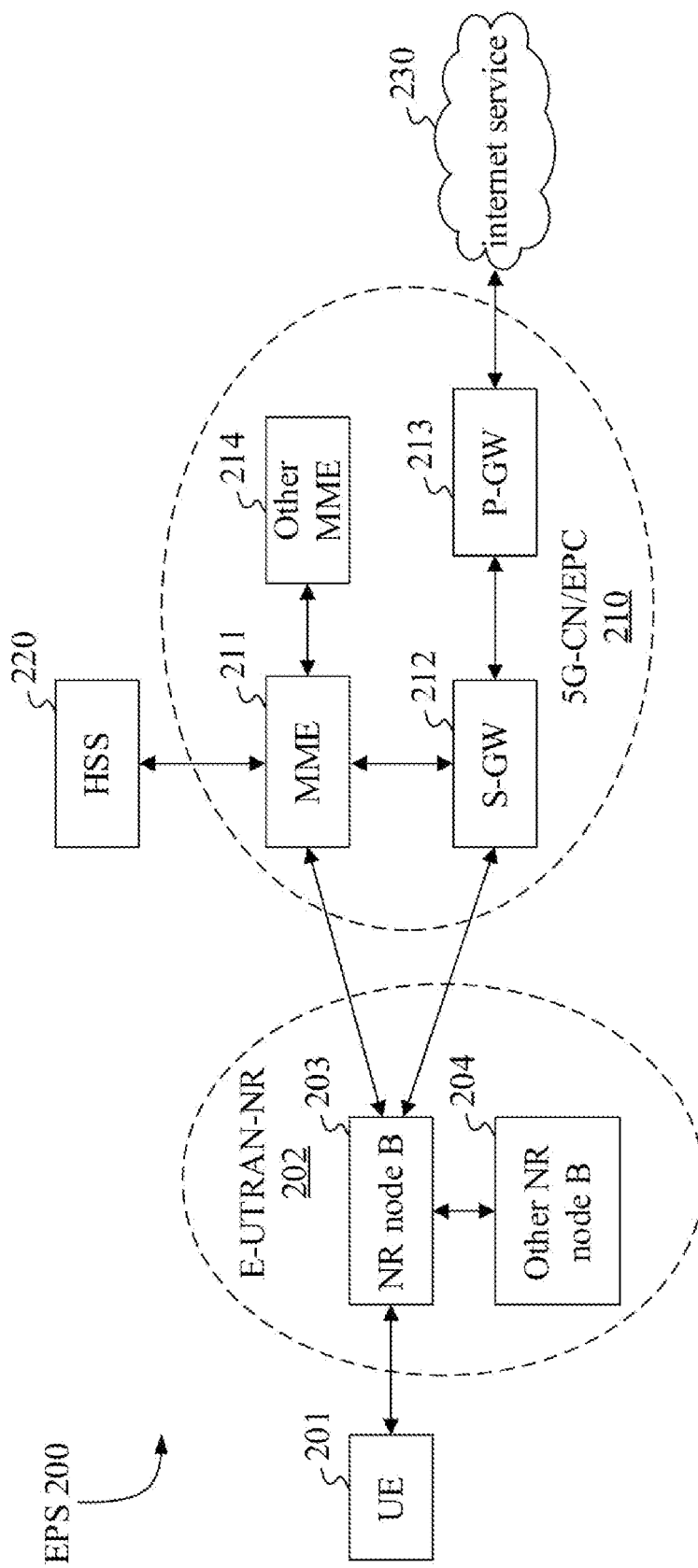
FIG. 2 is a schematic diagram illustrating a network architecture according to an embodiment of the disclosure.

Embodiment 2 illustrates a schematic diagram of a network architecture according to the disclosure, as shown in FIG. 2.

FIG. 2 illustrates a network architecture 200 of Long-Term Evolution (LTE), Long-Term Evolution Advanced (LTE-A) and a future 5G system. The LTE network architecture 200 may be referred to as an Evolved Packet System (EPS) 200. The EPS 200 may include one or more of User Equipment (UE) 201, Evolved UMTS Terrestrial Radio Access Network-New Radio (E-UTRAN-NR) 202, 5G-CoreNetwork (5G-CN)/Evolved Packet Core (EPC) 210, a Home Subscriber Server (HSS) 220 and an Internet Service 230, wherein the UMTS corresponds to the Universal Mobile Telecommunications System. The EPS may be interconnected with other access networks. For simple description, the entities/interfaces are not shown. As shown in FIG. 2, the EPS provides packet switching services. Those skilled in the art are easy to understand that various concepts presented throughout the disclosure can be extended to networks providing circuit switching services. The E-UTRAN-NR includes an NR node B (gNB) 203 and other gNBs 204. The gNB 203 provides UE 201 oriented user plane and control plane protocol terminations. The gNB 203 may be connected to other gNBs 204 via an X2 interface (for example, backhaul). The gNB 203 may be called a base station, a base transceiver station, a radio base station, a radio transceiver, a transceiver function, a Basic Service Set (BSS), an Extended Service Set (ESS), a Transmitter Receiver Node (TRP) or other appropriate terms. The gNB 203 provides an access point of the 5G-CN/EPC 210 for the UE 201. Examples of UE 201 include cellular phones, smart phones, Session Initiation Protocol (SIP) phones, laptop computers, Personal Digital Assistants (PDAs), Satellite Radios, Global Positioning Systems, multimedia devices, video devices, digital audio player (for example, MP3 players), cameras, games consoles, unmanned aerial vehicles, air vehicles, narrow-band Internet of Things equipment, machine-type communication equipment, land vehicles, automobiles, wearable equipment, or any other devices having similar functions. Those skilled in the art also can call the UE 201 a mobile station, a subscriber station, a mobile unit, a subscriber unit, a wireless unit, a remote unit, a mobile device, a wireless device, a radio communication device, a remote device, a mobile subscriber station, an access terminal, a mobile terminal, a wireless terminal, a remote terminal, a handset, a user proxy, a mobile client, a client or other appropriate terms. The gNB 203 is connected to the 5G-CN/EPC 210 via an S1 interface. The 5G-CN/EPC 210 includes an MME 211, other MMEs 214, a Service Gateway (S-GW) 212 and a Packet Data Network Gateway (P-GW) 213. The MME 211 is a control node for processing a signaling between the UE 201 and the 5G-CN/EPC 210. Generally, the MME 211 provides bearer and connection management. All user Internet Protocol (IP) packets are transmitted through the S-GW 212. The S-GW 212 is connected to the P-GW 213. The P-GW 213 provides UE IP address allocation and other functions. The P-GW 213 is connected to the Internet service 230. The Internet service 230 includes IP services corresponding to operators, specifically including Internet, Intranet, IP Multimedia Subsystems (IP IMSs) and Packet Switching Streaming Services (PSSs).

In one embodiment, the UE 201 corresponds to the first node in the disclosure, and the gNB 203 corresponds to the second node in the disclosure.

In one embodiment, the UE 201 corresponds to the second node in the disclosure, and the gNB 203 corresponds to the first node in the disclosure.

Embodiment 3

Figure 3:
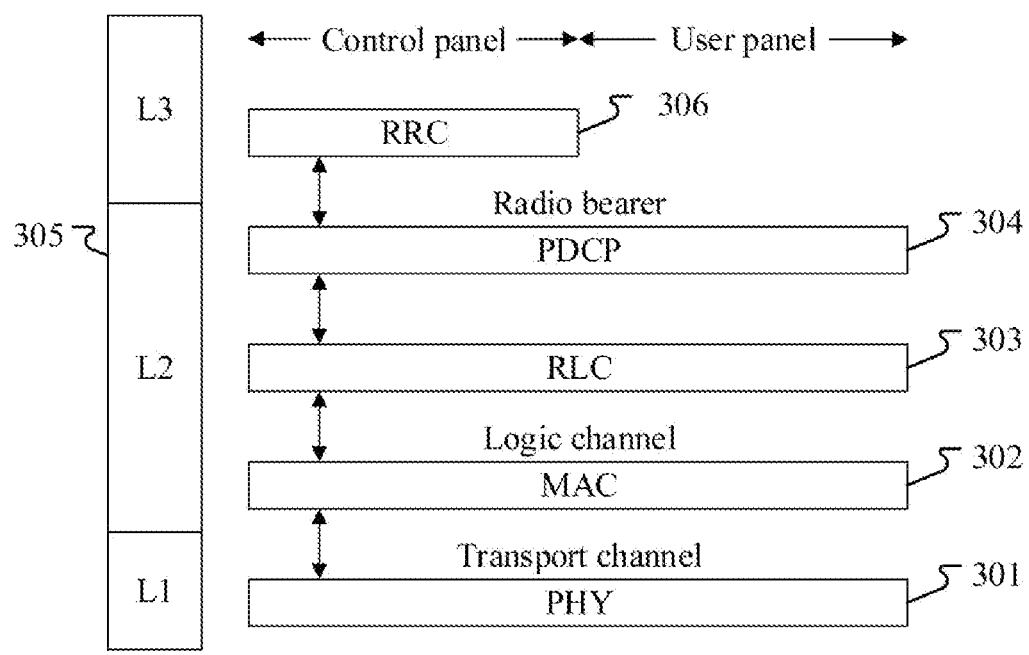
FIG. 3 is a schematic diagram illustrating a radio protocol architecture of a user plane and a control plane according to an embodiment of the disclosure.

Embodiment 3 is a schematic diagram illustrating a radio protocol architecture of a user plane and a control plane, as shown in FIG. 3.

FIG. 3 is a schematic diagram illustrating a radio protocol architecture of a user plane and a control plane. In FIG. 3, the radio protocol architecture of the UE and the gNB is represented by three layers, which are a layer 1, a layer 2 and a layer 3 respectively. The layer 1 (L1) 301 is the lowest layer and performs signal processing functions of each PHY layer. The layer 1 is called PHY 301 in this paper. The layer 2 (L2) 305 is above the PHY 301, and is in charge of the link between the UE and the gNB via the PHY 301. In the user plane, the L2 305 includes a Medium Access Control (MAC) sublayer 302, a Radio Link Control (RLC) sublayer 303, and a Packet Data Convergence Protocol (PDCP) sublayer 304. All the three sublayers terminate at the gNB of the network side. Although not described in FIG. 3, the UE may include several protocol layers above the L2 305, such as a network layer (i.e. IP layer) terminated at a P-GW 213 of the network side and an application layer terminated at the other side of the connection (i.e. a peer UE, a server, etc.). The PDCP sublayer 304 provides multiplexing among variable radio bearers and logical channels. The PDCP sublayer 304 also provides a header compression for a higher-layer packet so as to reduce a radio transmission overhead. The PDCP sublayer 304 provides security by encrypting a packet and provides support for the UE handover between the gNBs. The RLC sublayer 303 provides segmentation and reassembling of a higher-layer packet, retransmission of a lost packet, and reordering of a lost packet so as to compensate the disordered receiving caused by Hybrid Automatic Repeat Request (HARQ). The MAC sublayer 302 provides multiplexing between logical channels and transport channels. The MAC sublayer 302 is also responsible for allocating between the UEs various radio resources (i.e., resource block) in a cell. The MAC sublayer 302 is also in charge of HARQ operation. In the control plane, the radio protocol architecture of the UE and the gNB is almost the same as the radio protocol architecture in the user plane on the PHY 301 and the L2 305, but there is no header compression function for the control plane. The control plane also includes a Radio Resource Control (RRC) sublayer 306 in the layer 3 (L3). The RRC sublayer 306 is responsible for acquiring radio resources (i.e. radio bearer) and configuring the lower layers using an RRC signaling between the gNB and the UE.

In one embodiment, the radio protocol architecture of FIG. 3 is applicable to the first node in the disclosure.

In one embodiment, the radio protocol architecture of FIG. 3 is applicable to the second node in the disclosure.

In one embodiment, the first bit block in the disclosure is generated in the RRC sublayer 306.

In one embodiment, the first bit block in the disclosure is generated in the MAC sublayer 302.

In one embodiment, the second bit block in the disclosure is generated in the PHY 301.

In one embodiment, the third bit block in the disclosure is generated in the PHY 301.

In one embodiment, the first radio signal in the disclosure is generated in the PHY 301.

Embodiment 4

Figure 4:
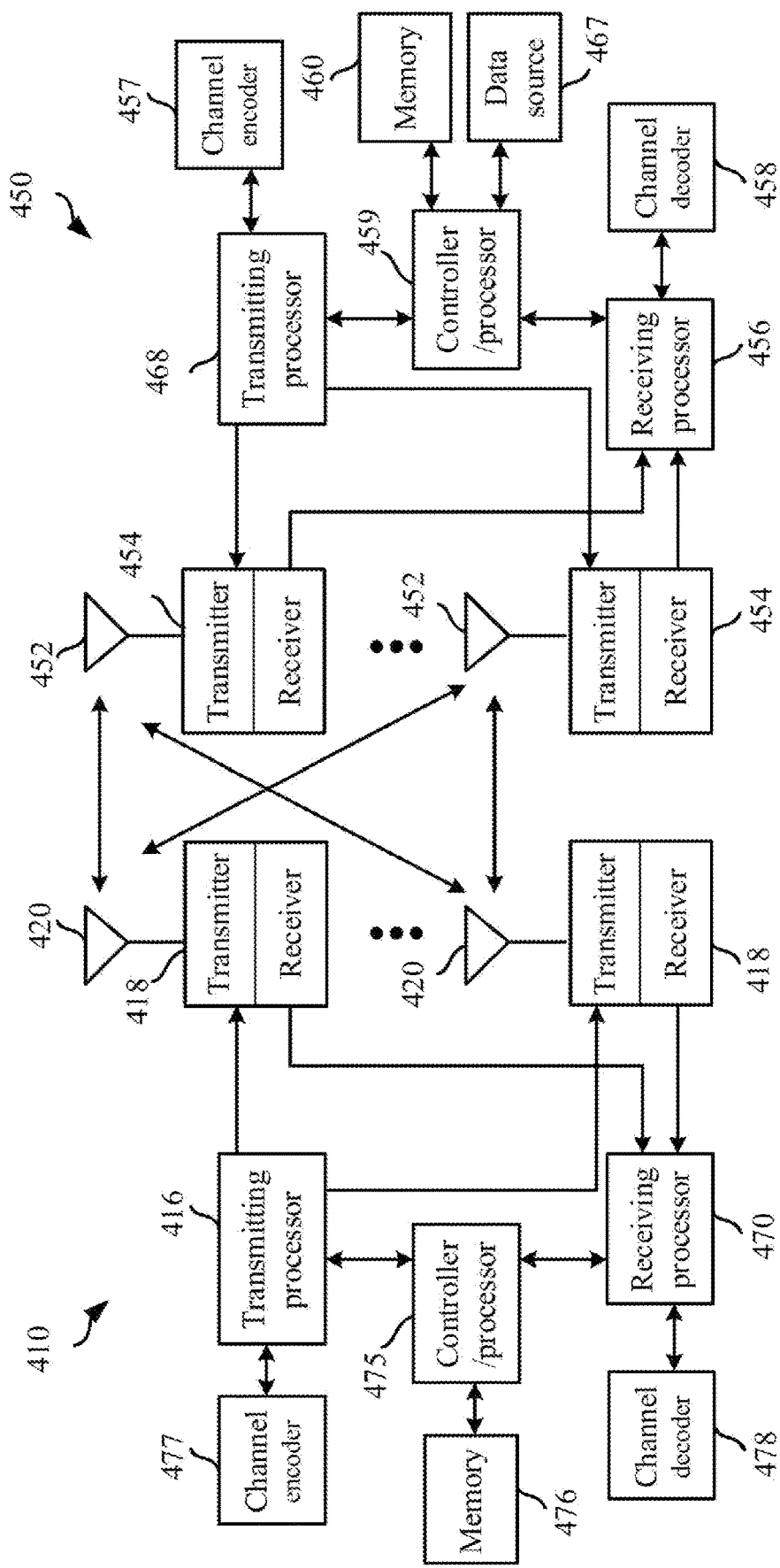
FIG. 4 is a schematic diagram illustrating an evolved node and UE according to an embodiment of the disclosure.

Embodiment 4 is a schematic diagram illustrating an evolved node and UE, as shown in FIG. 4.

The gNB 410 comprises a controller/processor 475, a memory 476, a receiving processor 470, a transmitting processor 416, a channel encoder 477, a channel decoder 478, a transmitter/receiver 418, and an antenna 420.

The UE 450 comprises a controller/processor 459, a memory 460, a data source 467, a transmitting processor 468, a receiving processor 456, a channel encoder 457, a channel decoder 458, a transmitter/receiver 454, and an antenna 452.

In Downlink (DL), at the gNB, higher layer packets from the core network are provided to the controller/processor 475. The controller/processor 475 implements the functionality of the L2 layer. In the DL, the controller/processor 475 provides header compression, encryption, packet segmentation and reordering, multiplexing between logical and transport channels, and allocates radio resources of the UE 450 based on various priority metrics. The controller/processor 475 is also responsible for HARQ operations, retransmission of lost packets, and signaling to the UE 450. The transmitting processor 416 and the channel encoder 477 implement various signal processing functions for the L1 layer (i.e., the physical layer). The channel encoder 477 implements encoding and interleaving to facilitate Forward Error Correction (FEC) at the UE 450. The transmitting processor 416 implements mapping of signal clusters based on various modulation schemes (e.g., Binary Phase Shift Keying (BPSK), Quadrature Phase Shift Keying (QPSK), M Phase Shift Keying (M-PSK), M Quadrature Amplitude Modulation (M-QAM)) and performs spatial precoding/beamforming processing of the encoded and modulated symbols to generate one or more spatial streams. The transmitting processor 416 then maps each spatial stream to subcarriers, multiplexes with reference signals (e.g., pilots) in time and/or frequency domain, and then generates the physical channel of the payload time domain multicarrier symbol stream using an Inverse Fast Fourier Transform (IFFT). Each transmitter 418 converts the baseband multicarrier symbol stream provided by the transmitting processor 416 into a radio frequency stream, which is then provided to a different antenna 420.

In DL (Downlink), at the UE 450, each receiver 454 receives a signal through its respective antenna 452. Each receiver 454 recovers the information modulated onto the radio frequency carrier and converts the radio frequency stream into a baseband multicarrier symbol stream to be provided to the receiving processor 456. The receiving processor 456 and the channel decoder 458 implement various signal processing functions of the L1 layer. The receiving processor 456 converts the baseband multicarrier symbol stream from time domain to frequency domain using a Fast Fourier Transform (FFT). In frequency domain, the physical layer data signal and the reference signal are demultiplexed by the receiving processor 456, wherein the reference signal is to be used for channel estimation, and the physical layer data is recovered out of the spatial stream with the UE 450 as the destination in the receiving processor 456 by multi-antenna detection. The symbols on each spatial stream are demodulated and recovered in the receiving processor 456 and a soft decision is generated. The channel decoder 458 then decodes and deinterleaves the soft decision to recover the higher layer data and control signals transmitted by gNB 410 on the physical channel. The higher layer data and control signals are then provided to the controller/processor 459. The controller/processor 459 implements the functions of the L2 layer. The controller/processor can be associated with a memory 460 in which program codes and data are stored. The memory 460 can be referred to as a computer readable medium. In the DL, the controller/processor 459 provides demultiplexing between the transport and logical channels, packet reassembly, decryption, header decompression, and control signal processing to recover higher layer packets from the core network. The higher layer packet is then provided to all protocol layers above the L2 layer. Various control signals can also be provided to the L3 so as to be processed by the L3. The controller/processor 459 is also responsible for error detection using an acknowledgement (ACK) and/or negative acknowledgement (NACK) protocol to support HARQ operations.

In UL (Uplink), at the UE 450, data source 467 is used to provide higher layer packets to the controller/processor 459. The data source 467 represents all protocol layers above the L2 layer. Similar to the transmitting function at the gNB 410 described in the DL, the controller/processor 459 implements header compression, encryption, packet segmentation and reordering, and multiplexing between the logical and transport channels based on the radio resource allocation of the gNB 410 and implements L2 layer functions for the user plane and the control plane. The controller/processor 459 is also responsible for HARQ operations, retransmission of lost packets, and signaling to the gNB 410. The channel encoder 457 performs channel coding. The encoded data is modulated into a multicarrier/single-carrier symbol stream by modulation performed by the transmitting processor 468 and multi-antenna spatial pre-coding/beamforming processing, and is then provided to different antennas 452 via the transmitter 454. Each transmitter 454 first converts the baseband symbol stream provided by the transmitting processor 468 into a radio frequency symbol stream, which is then provided to the antenna 452.

In UL (Uplink), the function at the gNB 410 is similar to the receiving function at the UE 450 described in the DL. Each receiver 418 receives a radio frequency signal through its respective antenna 420, converts the received radio frequency signal into a baseband signal, and provides the baseband signal to the receiving processor 470. The receiving processor 470 and the channel decoder 478 collectively implement the functions of the L1 layer. The controller/processor 475 implements the functions of the L2 layer. The controller/processor 475 can be associated with memory 476 in which program codes and data are stored. The memory 476 can be referred to as a computer readable medium. In the UL, the controller/processor 475 provides demultiplexing between the transport and logical channels, packet reassembly, decryption, header decompression, and control signal processing to recover higher layer packets from the UE 450. The higher layer packets from the controller/processor 475 can be provided to the core network. The controller/processor 475 is also responsible for error detection using ACK and/or NACK protocols to support HARQ operations.

In one embodiment, the UE 450 comprises: at least one processor and at least one memory, wherein the at least one memory includes a computer program code; the at least one memory and the computer program code are configured to be used together with the at least one processor.

In one embodiment, the UE 450 comprises: a memory in which a computer-readable instruction program is stored, wherein the computer-readable instruction program generates an action when executed by the at least one processor. The action including: determining the first bit block in the disclosure; transmitting the first radio signal in the disclosure; and performing the channel coding in the disclosure.

In one embodiment, the UE 450 comprises: a memory in which a computer-readable instruction program is stored, wherein the computer-readable instruction program generates an action when executed by the at least one processor. The action including: recovering the first bit block in the disclosure; receiving the first radio signal in the disclosure; and performing the channel decoding in the disclosure.

In one embodiment, the gNB 410 comprises: at least one processor and at least one memory, wherein the at least one memory includes a computer program code; the at least one memory and the computer program code are configured to be used together with the at least one processor.

In one embodiment, the gNB 410 comprises: a memory in which a computer-readable instruction program is stored, wherein the computer-readable instruction program generates an action when executed by the at least one processor. The action including: recovering the first bit block in the disclosure; receiving the first radio signal in the disclosure; and performing the channel decoding in the disclosure.

In one embodiment, the gNB 410 comprises: a memory in which a computer-readable instruction program is stored, wherein the computer-readable instruction program generates an action when executed by the at least one processor. The action including: determining the first bit block in the disclosure; transmitting the first radio signal in the disclosure; and performing the channel coding in the disclosure.

In one embodiment, the UE 450 corresponds to the first node in the disclosure, and the gNB 410 corresponds to the second node in the disclosure.

In one embodiment, the UE 450 corresponds to the second node in the disclosure, and the gNB 410 corresponds to the first node in the disclosure.

In one embodiment, at least one of the controller/processor 459, the memory 460, and the data source 467 is used to determine the first bit block, at least one of the transmitting processor 468, the channel encoder 457, and the controller/processor 459 is used to generate the second bit block in the disclosure and the third bit block in the disclosure; and at least one of the receiving processor 470, the channel decoder 478, the controller/processor 475, and the memory 476 is used to recover the first bit block.

In one embodiment, at least one of the transmitting processor 468, the channel encoder 457, the controller/processor 459, the transmitter 454, and the antenna 452 is used to transmit the first radio signal; and at least one of the receiving processor 470, the channel decoder 478, the controller/processor 475, the receiver 418, and the antenna 420 is used to receive the first radio signal.

In one embodiment, the channel encoder 457 is used to perform the channel coding in the disclosure; and the channel decoder 478 is used to perform the channel decoding in the disclosure.

In one embodiment, at least one of the controller/processor 475 and the memory 476 is used to determine the first bit block, at least one of the transmitting processor 416, the channel encoder 477, and the controller/processors 475 is used to generate the second bit block in the disclosure and the third bit block in the disclosure; and at least one of the receiving processor 456, the channel decoder 458, the controller/processor 459, the memory 460, and the data source 467 is used to recover the first bit block.

In one embodiment, at least one of the transmitting processor 416, the channel encoder 477, the controller/processor 475, the transmitter 418, and the antenna 420 is used to transmit the first radio signal; and at least one of the receiving processor 456, the channel decoder 458, the controller/processor 459, the receiver 454, and the antenna 452 is used to receive the first radio signal.

In one embodiment, the channel encoder 477 is used to perform the channel coding in the disclosure; and the channel decoder 458 is used to perform the channel decoding in the disclosure.

Embodiment 5

Figure 5:
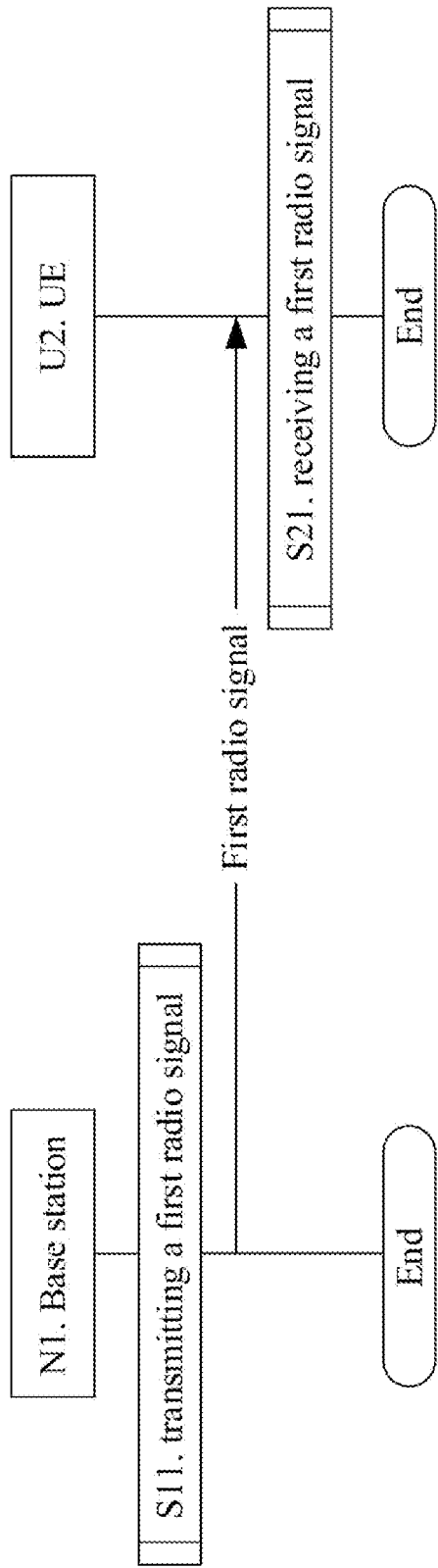
FIG. 5 is a flow chart illustrating wireless transmission according to an embodiment of the disclosure.

Embodiment 5 is a flow chart illustrating wireless transmission, as shown in FIG. 5. In FIG. 5, the base station N1 is a serving cell maintenance base station of the UE U2.

The N1 transmits a first radio signal in step S11.

The U2 receives a first radio signal in step S21.

In Embodiment 5, a third bit block is used by the N1 to generate the first radio signal, the third bit block comprises bits in a second bit block and bits in a first bit block, and the bits in the first bit block is used by the N1 to generate the bits in the second bit block. The first bit block and the second bit block comprise P1 second-type bits and P2 first-type bits, respectively, and the third bit block comprise P3 binary bits. Any one of {the P1 second-type bits, the P2 first-type bits} is a binary bit. The P1, the P2 and the P3 are positive integers, respectively. A position of a reference first-type bit in the third bit block is related to the number of bits in the first bit block associated with the reference first-type bit, the reference first-type bit is one of the P2 first-type bits; or a position of a reference second-type bit in the third bit block is related to positions of the bits in the second bit block associated with the reference second-type bit in the third bit block, and the reference second-type bit is one of the P1 second-type bits.

In one embodiment, the first bit block is generated on a physical layer of the N1.

In one embodiment, the N1 generates the first bit block according to a scheduling result.

In one embodiment, the first radio signal is an output after the third bit block is sequentially subjected to channel coding, scrambling, a modulation mapper, a layer mapper, precoding, a resource element mapper, and wideband symbol generation.

In one embodiment, the third bit block is used by the N1 as an input to the channel coding, an output of the channel coding is used to generate the first radio signal, and the channel coding is based on a polar code. Any two bits in the third bit block are mapped onto two different sub-channels, respectively. A channel capacity of a sub-channel mapped by any one bit of a first bit set is larger than a channel capacity of a sub-channel mapped by any one bit of a second bit set.

In one sub-embodiment of the above embodiment, the P2 first-type bits belong to the first bit set, and the P1 second-type bits belong to the second bit set.

In one sub-embodiment of the above embodiment, the P2 first-type bits belong to the second bit set, and the P1 second-type bits belong to the first bit set.

In one sub-embodiment of the above embodiment, a part of the P2 first-type bits and the P1 second-type bits belong to the first bit set, and another part of the P2 first-type bits belongs to the second bit set.

In one sub-embodiment of the above embodiment, a part of the P2 first-type bits belongs to the first bit set, and another part of the P2 first-type bits and the P1 second-type bits belong to the second bit set.

In one embodiment, the first radio signal is used by the U2 to generate an input to the channel decoding, and channel coding corresponding to the channel decoding is based on a polar code. The channel decoding is used to determine P3 reference values, and the P3 reference values are respectively corresponding to P3 bits in the third bit block.

In one sub-embodiment of the above embodiment, a reference value corresponding to at least one of the P2 first-type bits is used by the U2 for pruning in the channel decoding.

In one sub-embodiment of the above embodiment, a reference value corresponding to at least one of the P2 first-type bits is used by the U2 to determine whether the first bit block is received correctly.

In one embodiment, the CRC bit block of the first bit block is used by the N1 to generate the second bit block.

In one embodiment, the first bit block comprises downlink control information.

In one sub-embodiment of the above embodiment, the downlink control information indicates at least one of {occupied time domain resources, occupied frequency domain resources, a Modulation and Coding Scheme (MCS), a Redundancy Version (RV), a New Data Indicator (NDI), a Hybrid Automatic Repeat reQuest (HARQ) process number} of a corresponding data.

Embodiment 6

Figure 6:
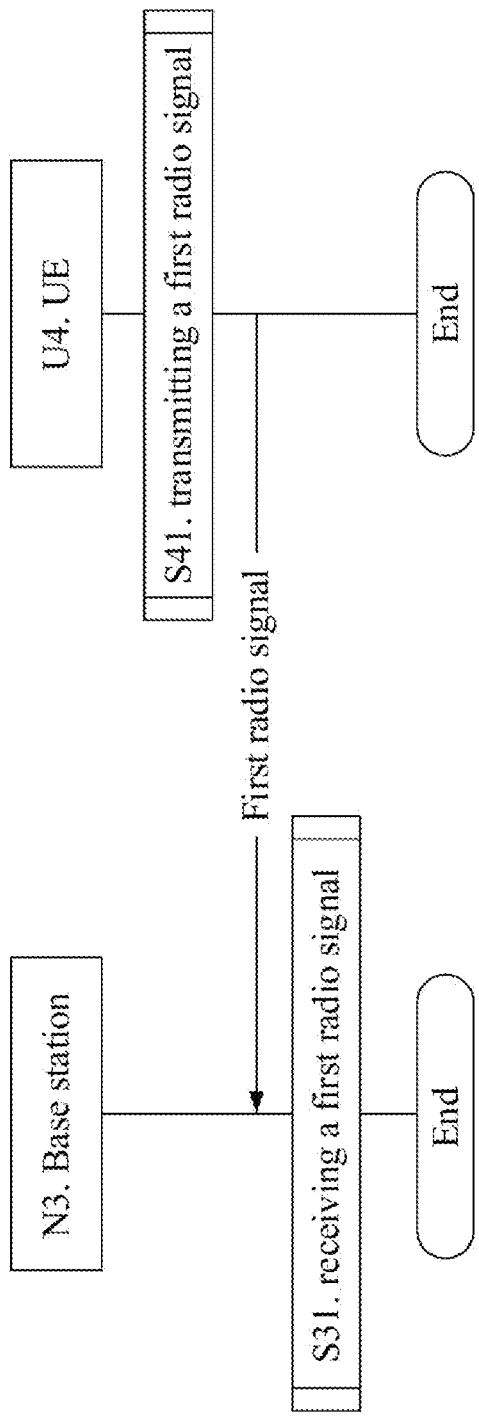
FIG. 6 is a flow chart illustrating wireless transmission according to another embodiment of the disclosure.

Embodiment 6 is a flow chart illustrating wireless transmission, as shown in FIG. 6. In FIG. 6, the base station N3 is a serving cell maintenance base station of the UE U4.

The N3 receives a first radio signal in step S31.

The U4 transmits a first radio signal in step S41.

In Embodiment 6, a third bit block is used by the U4 to generate the first radio signal, the third bit block comprises bits in a second bit block and bits in a first bit block, and the bits in the first bit block is used by the U4 to generate the bits in the second bit block. The first bit block and the second bit block comprise P1 second-type bits and P2 first-type bits, respectively, and the third bit block comprise P3 binary bits. Any one of {the P1 second-type bits, the P2 first-type bits} is a binary bit. The P1, the P2 and the P3 are positive integers, respectively. A position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, and the reference second-type bit is one of the P1 second-type bits.

In one embodiment, the first bit block is generated on a physical layer of the U4.

In one embodiment, the U4 generates the first bit block according to a scheduling result of the N3.

In one embodiment, the first radio signal is an output after the third bit block is sequentially subjected to channel coding, scrambling, a modulation mapper, a layer mapper, a transform precoder (configured to generate a complex value signal), precoding, a resource element mapper, and wideband symbol generation.

In one embodiment, the first bit block comprises uplink control information.

In one sub-embodiment of the above embodiment, the uplink control information indication indicates at least one of {HARQ-ACK (Acknowledgement), Channel State Information (CSI), Scheduling Request (SR), CRI}.

Embodiment 7

Figure 7:
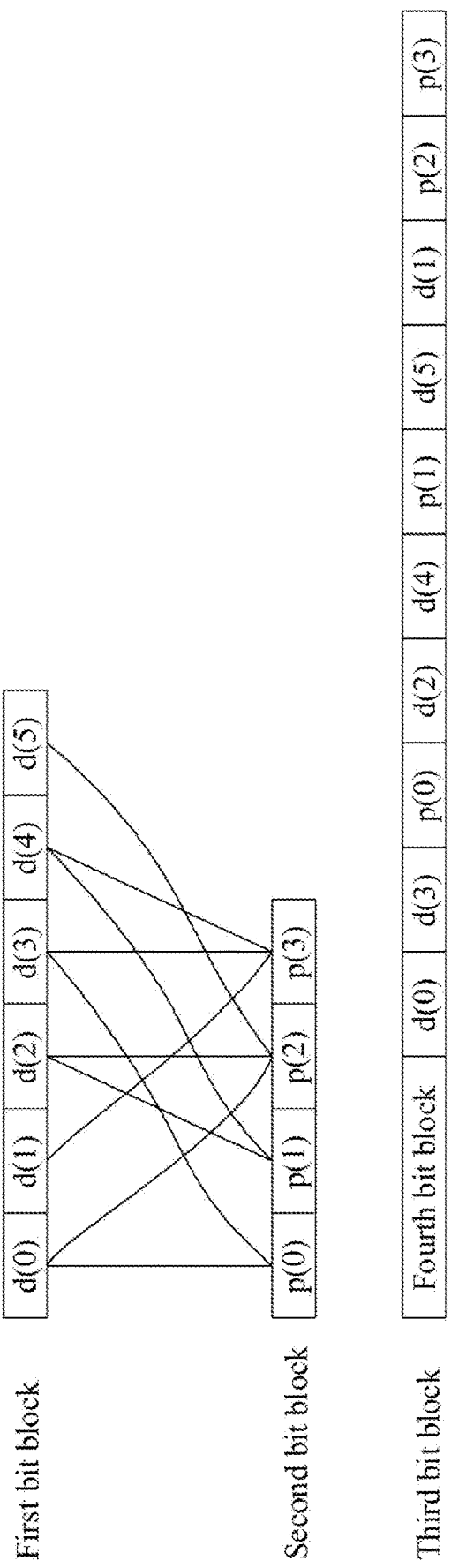
FIG. 7 is a schematic diagram illustrating a mapping relationship between bits in a first bit block, a second bit block, and a third bit block according to an embodiment of the disclosure.

Embodiment 7 illustrating a mapping relationship between bits in a first bit block, a second bit block, and a third bit block, as shown in FIG. 7.

In Embodiment 7, the bits in the first bit block are used to generate the bits in the second bit block, and the third bit block comprises the bits in the second bit block and the bits in the first bit block. The first bit block and the second bit block comprise P1 second-type bits and P2 first-type bits, respectively, and the third bit block comprise P3 binary bits. Any one of {the P1 second-type bits, the P2 first-type bits} is a binary bit. The P1, the P2 and the P3 are positive integers, respectively. A position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, and the reference second-type bit is one of the P1 second-type bits.

In FIG. 7, the P1 is equal to 6, the P2 is equal to 4, the bits in the first bit block are represented by d(i), and the i is an integer greater than or equal to 0 and less than P1; the bits in the second bit block are represented by p(j), and the j is an integer greater than or equal to 0 and less than the P2. Any bit in the first bit block and its associated bit in the second bit block are connected by a solid line.

In one embodiment, for an arbitrary bit of the second bit block, the arbitrary bit is equal to a sum of a positive integer number of bits in the first bit block modulo 2. For example, p(0) in FIG. 7 is equal to the sum of d(0) and d(3) modulo 2.

In one embodiment, for an arbitrary bit of the second bit block, the arbitrary bit is obtained by performing XOR operation between a sum of a positive integer number of bits in the first bit block modulo 2 and a corresponding bit in a scrambling sequence. For example, p(0) in FIG. 7 is obtained by performing XOR operation between the sum of d(0) and d(3) modulo 2 and to corresponding bit in the scrambling sequence.

In one embodiment, for an arbitrary bit of the first bit block, the arbitrary bit is used to determine at least one bit in the second bit block. For example, d(0) in FIG. 7 is used to determine p(0) and p(2).

In one embodiment, the first bit block is independent of bits outside the second bit block.

In one embodiment, the P3 is equal to the P1 plus the P2 plus P4, the P4 is the number of bits included in the fourth bit block, and the P4 is a positive integer.

In one sub-embodiment of the above embodiment, the P4 is equal to 0, and the third bit block consists of all bits in the second bit block and all bits in the first bit block.

In one sub-embodiment of the above embodiment, the P4 is greater than 0, and the third bit block consists of {all bits in the second bit block, all bits in the first bit block, all bits in the fourth bit block}.

In one sub-embodiment of the above embodiment, the values of all the bits in the fourth bit block are preset.

In one sub-embodiment of the above embodiment, all bits in the fourth bit block are 0.

In one embodiment, the bits in the second bit block are sequentially arranged in the third bit block according to the numbers of associated bits in the first bit block.

In one sub-embodiment of the above embodiment, the position of the third bit in the third bit block is prior to the position of the fourth bit in the third bit block, the third bit and the fourth bit are any two bits in the second bit block, and the number of bits in the first bit block associated with the third bit is less than the number of bits in the first bit block associated with the fourth bit. For example, in FIG. 7, p(0) is associated with two bits d(0) and d(3) in the first bit block, and p(2) is associated with three bits d(0), d(2) and d(5) in the first bit block. The position of p(0) in the third bit block is prior to the position of p(2) in the third bit block.

In one embodiment, all of second-type bits associated with a given first-type bit are arranged prior to the given first-type bit in the third bit block, and the given first-type bit is one of the P2 first-type bits. For example, in FIG. 7, p(1) is associated with {d(2), d(4)}, and {d(2), d(4)} is arranged prior to p(1) in the third bit block.

In one embodiment, among first-type bits associated with a first target bit and independent of a second target bit, a first bit is arranged foremost in the third bit block. Among first-type bits associated with the second target bit and independent of the first target bit, a second bit is arranged foremost in the third bit block. The first bit is prior to the second bit, and a position of the first target bit in the third bit block is prior to a position of the second target bit in the third bit block. The first target bit and the second target bit are any two of the P1 second-type bits. For example, in FIG. 7, d(0) is prior to d(4) in the third bit block. {p(0), p(2)} is associated with d(0) and is independent of d(4), {p(1), p(3)} is associated with d(4) and is independent of d(0); p(0) is prior to p(2) in the third bit block, p(1) is prior to p(3) in the third bit block; p(0) is prior to p(1) in the third bit block.

Embodiment 8

Figure 8:
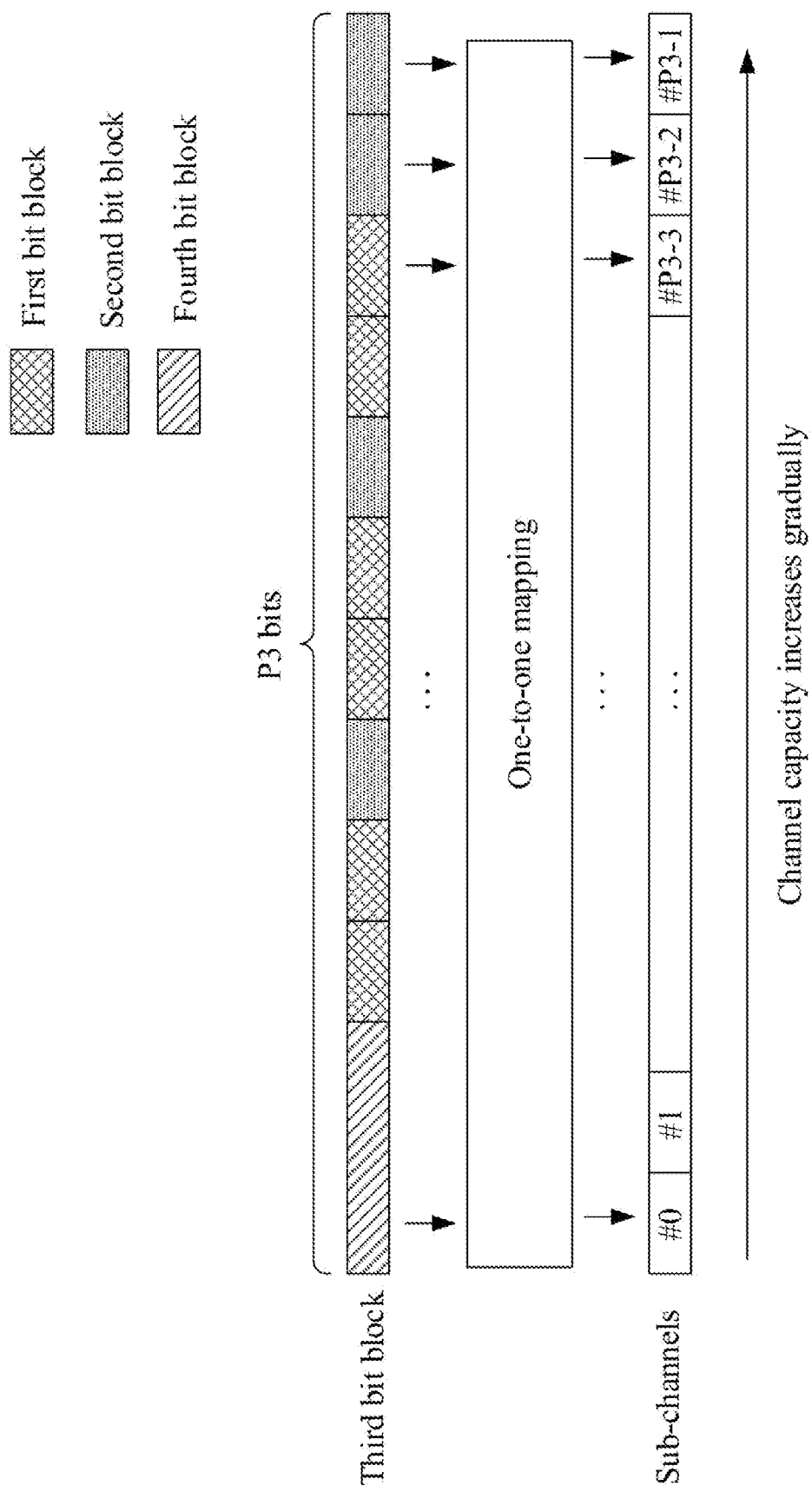
FIG. 8 is a schematic diagram illustrating mapping of bits in a third bit block on sub-channels according to an embodiment of the disclosure.

Embodiment 8 is a schematic diagram illustrating mapping of bits in a third bit block on sub-channels, as shown in FIG. 8.

In Embodiment 8, the third bit block is used as the input to the channel coding, and the channel coding is based on a polar code. The third bit block comprises P3 bits, the P3 bits are mapped to P3 sub-channels, and channel capacities of the P3 sub-channels are sequentially increased from left to right. The channel capacity of the sub-channel mapped by any one bit of the first bit set is larger than the channel capacity of the sub-channel mapped by any one bit of the second bit set. The third bit block consists of {all bits in the second bit block, all bits in the first bit block, and all bits in the fourth bit block}. The first bit block and the second bit block comprise P1 second-type bits and P2 first-type bits, respectively, the fourth bit block comprises P4 binary bits, the P1 and the P2 are positive integers, respectively, and the P4 is a non-negative integer.

In FIG. 8, a square filled with a cross line represents the bits in the first bit block; a square filled with a dot represents the bits in the second bit block; a square filled with a left oblique line represents the bits in the fourth bit block.

In one embodiment, there is no common bit in the first bit set and the second bit set.

In one embodiment, any bit in the third bit block belongs to one of {the first bit set, the second bit set}.

In one embodiment, the P2 first-type bits belong to the first bit set, and the P1 second-type bits belong to the second bit set.

In one embodiment, the P2 first-type bits belong to the second bit set, and the P1 second-type bits belong to the first bit set.

In one embodiment, the part of the P2 first-type bits belongs to the first bit set, and the other part of the P2 first-type bits belongs to the second bit set.

In one embodiment, the part of the P2 first-type bits belongs to the first bit set, and the other part of the P2 first-type bits and the P1 second-type bits belong to the second bit set.

In one embodiment, the part of the P2 first-type bits belongs to the first bit set, and {the other part of the P2 first-type bits, the P1 second-type bits, the bits in the fourth bit block} belong to the second bit set.

In one embodiment, the part of the P2 first-type bits and the P1 second-type bits belong to the first bit set, and the other part of the P2 first-type bits belongs to the second bit set.

In one embodiment, the part of the P2 first-type bits and the P1 second-type bits belong to the first bit set, and the other part of the P2 first-type bits and the bits in the fourth bit block belong to the second bit set.

In one embodiment, the bits in the fourth bit block belong to a third bit set, and a channel capacity of a sub-channel mapped by any one bit of the third bit set is smaller than the channel capacity of the sub-channel mapped by any one bit of the second bit set.

In one embodiment, the part of the P2 first-type bits is continuous in the third bit block, and the other part of the P2 first-type bits is discrete in the third bit block.

In one embodiment, the part of the P2 first-type bits is discrete in the third bit block, and the other part of the P2 first-type bits is continuous in the third bit block.

In one embodiment, the part of the P2 first-type bits and the other part of the P2 first-type bits constitute the second bit block.

In one embodiment, the part of the P2 first-type bits comprises P2/2 bit(s) in the second bit block, and the other part of the P2 first-type bits comprises the P2/2 bit(s) in the second bit block.

In one embodiment, any two different sub-channels have different channel capacities.

In one embodiment, the bits in the third bit block are sequentially mapped according to channel capacities of sub-channels.

In one embodiment, the bits in the third bit block are sequentially mapped according to indexes of sub-channels.

Embodiment 9

Figure 9:
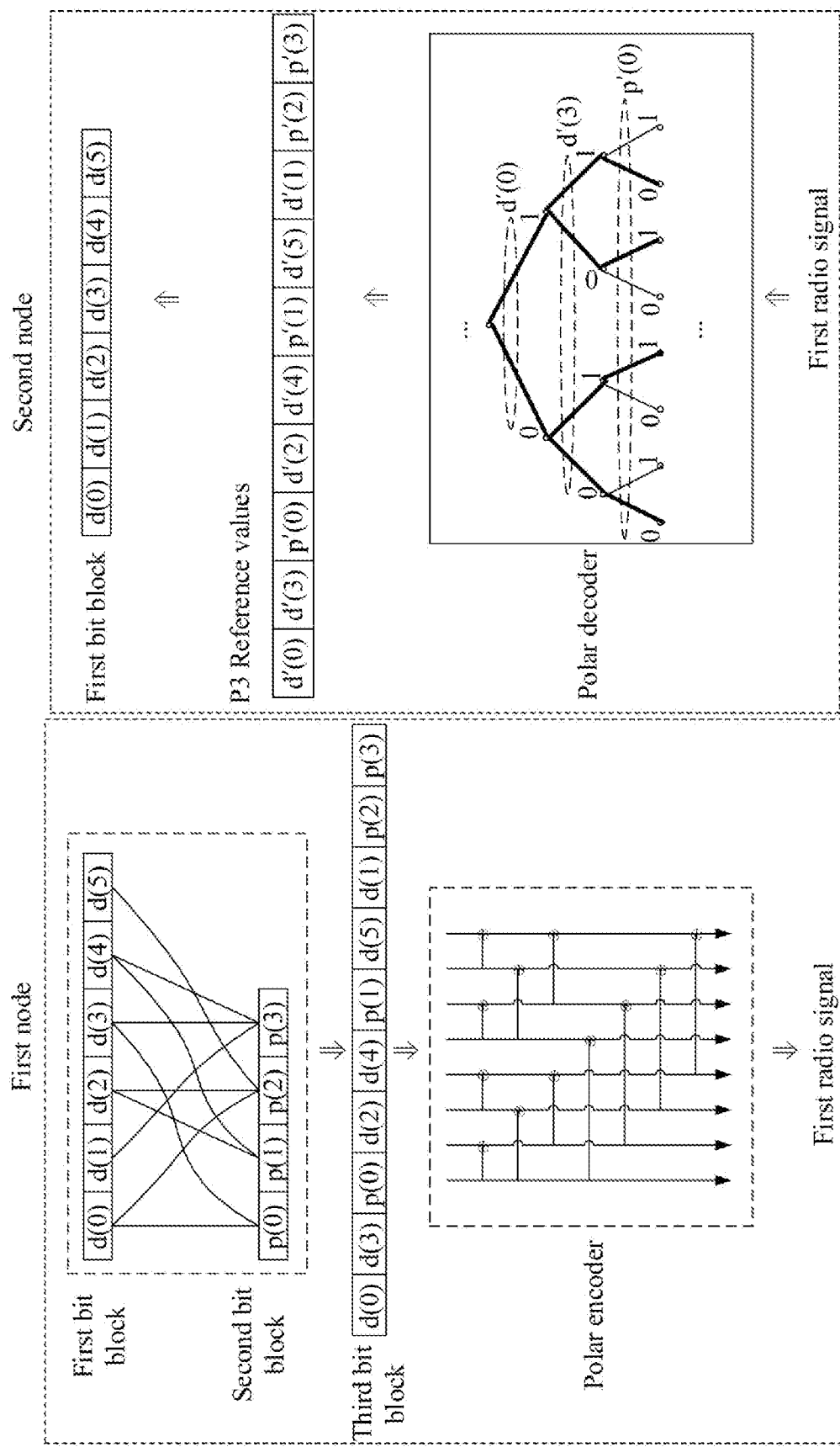
FIG. 9 is a schematic diagram illustrating a relationship between {a first bit block, a second bit block, a third bit block} and a first radio signal according to an embodiment of the disclosure.

Embodiment 9 is a schematic diagram illustrating a relationship between {a first bit block, a second bit block, a third bit block} and a first radio signal, as shown in FIG. 9.

In Embodiment 9, in the first node, the bits in the first bit block are used to generate the bits in the second bit block, the third bit block comprises the bits in the second bit block and the bits in the first bit block, the third bit block is used as the input to the channel coding, the output of the channel coding is used to generate the first radio signal, and channel coding is based on a polar code. The second bit block and the first bit block comprise P1 second-type bits and P2 first-type bits, respectively, the third bit block comprise P3 binary bits. In the second node, the first radio signal is used to generate the input to the channel decoding, and the channel coding corresponding to the channel decoding is based on a polar code. The channel decoding is used to determine P3 reference values, and the P3 reference values are respectively corresponding to P3 bits in the third bit block. A reference value corresponding to at least one of the P2 first-type bits is used for pruning in the channel decoding.

In FIG. 9, the P1 is equal to 6, the P2 is equal to 4, and the P3 is equal to the sum of the P1 and the P2. The bits in the first bit block are represented by d(i), and the i is an integer greater than or equal to 0 and less than P1; the bits in the second bit block are represented by p(j), and the j is an integer greater than or equal to 0 and less than P2. Any bit in the first bit block and its associated bit in the second bit block are connected by a solid line. The tree diagram in the decoder represents a portion of the paths associated with the bits {d(0), d(3), p(0)} in the channel decoding, and the positions of the bits {d(0), d(3), p(0)} in the third bit block is continuous.

In one embodiment, a reference value corresponding to at least one of the P2 first-type bits is used to determine whether the first bit block is received correctly. Reference values corresponding to first-type bits used to determine whether the first bit block is received correctly cannot be used for pruning in the channel decoding.

In one embodiment, the P3 reference values are bits recovered (received) for the corresponding (transmitted) bits, respectively.

In one embodiment, the P3 reference values are soft bits recovered (received) for the corresponding (transmitted) bits, respectively.

In one embodiment, the P3 reference values are Log Likelihood Ratios (LLR) estimated for the corresponding (transmitted) bits, respectively.

In one embodiment, the pruning is used to reduce surviving search paths in the channel decoding based on Viterbi criteria. For example, in the tree diagram of FIG. 9, the paths indicated by thick solid lines are surviving search paths, and other paths are deleted search paths.

In one embodiment, for a given reference value used for pruning, positions of bits corresponding to a pruned search path in the third bit block is prior to a position of a given first-type bit in the third bit block. The given reference value is a reference value used for pruning in the P3 reference values, and the given first-type bit is a first-type bit corresponding to the given reference value. For example, in FIG. 9, the reference value corresponding to p(0), denoted by p'(0) in FIG. 9, is used for pruning in the channel decoding. The bits corresponding to the pruned search path are d(0) and d(3). The positions of d(0) and d(3) in the third bit block are prior to p(0).

In one embodiment, the reference values corresponding to the P2 first-type bits (i.e., all bits in the second bit block) are used for pruning. For example, in FIG. 9, the reference values corresponding to {p(0), p(1), p(2), p(3)}, denoted by {p'(0), p'(1), p'(2), p'(3)} in FIG. 9, respectively, are all used for pruning.

In one embodiment, the reference values corresponding to the P2 first-type bits (i.e., all bits in the second bit block) are used to determine whether the first bit block is received correctly. For example, in FIG. 9, the reference values corresponding to {p(0), p(1), p(2), p(3)}, denoted by {p'(0), p'(1), p'(2), p'(3)} in FIG. 9, respectively, are all used to determine whether the first bit block is received correctly.

In one embodiment, the reference values corresponding to a part of the P2 first-type bits are used for pruning, and the reference values corresponding to another part of the P2 first-type bits are used to determine whether the first bit block is received correctly. For example, in FIG. 9, the reference values corresponding to {p(0), p(1)}, denoted by {p'(0), p'(1)} in FIG. 9, respectively, are used for pruning; the reference values corresponding to {p(2), p(3)}, denoted by {p'(2), p'(3)} in FIG. 9, respectively, are used to determine whether the first bit block is received correctly.

In one sub-embodiment of the above embodiment, the first-type bits of the P2 first-type bits used for pruning belong to the first bit set, and the first-type bits of the P2 first-type bits used to determine whether the first bit block is received correctly belong to the second bit set. The channel capacity of the sub-channel mapped by any one bit of the first bit set is larger than the channel capacity of the sub-channel mapped by any one bit of the second bit set.

In one sub-embodiment of the above embodiment, the first-type bits of the P2 first-type bits used for pruning belong to the second bit set, and the first-type bits of the P2 first-type bits used to determine whether the first bit block is received correctly belong to the first bit set.

In one embodiment, the first-type bits of the P2 first-type bits used to determine whether the first bit block is correctly recovered are further used to indicate the identifier of the target receiver of the first radio signal.

In one embodiment, the reference values corresponding to the first-type bits of the P2 first-type bits used to determine whether the first bit block is correctly recovered and the reference values corresponding to the first bit block together pass through CRC check, if the check result is correct, it is determined that the first bit block is correctly recovered; otherwise, it is determined that the first bit block is not correctly recovered.

Embodiment 10

Figure 10:
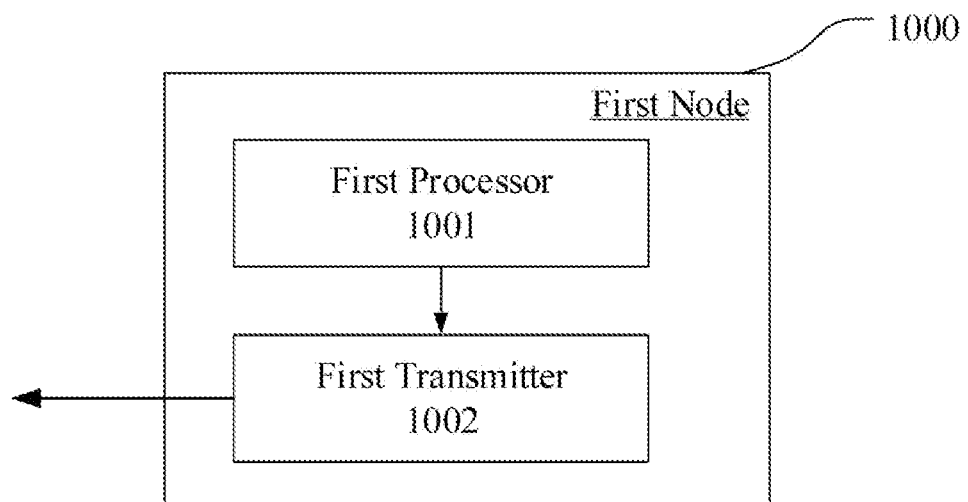
FIG. 10 is a block diagram illustrating the structure of a processing device in a first node for wireless communication according to an embodiment of the disclosure.

Embodiment 10 is a block diagram illustrating the structure of a processing device in a first node for wireless communication, as shown in FIG. 10.

In FIG. 10, the first node device 1000 mainly consists of a first processor 1001 and a first transmitter 1002.

The first processor 1001 determines a first bit block and generates a second bit block; the first transmitter 1002 generates a first radio signal and transmits the first radio signal.

In Embodiment 10, bits in the first bit block are used to generate bits in a second bit block, a third bit block comprises the bits in the second bit block and the bits in the first bit block, and the third bit block is used to generate the first radio signal. The first bit block and the second bit block comprise P1 second-type bits and P2 first-type bits, respectively, the third bit block comprise P3 binary bits, and any one of {the P1 second-type bits or the P2 first-type bits} is a binary bit. The P1, the P2 and the P3 are positive integers, respectively. A position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, and the reference second-type bit is one of the P1 second-type bits.

In one embodiment, the first processor 1001 further performs channel coding, wherein the third bit block is used as an input to the channel coding, an output of the channel coding is used to generate the first radio signal, and the channel coding is based on a polar code. Any two bits in the third bit block are mapped onto two different sub-channels, respectively. A channel capacity of a sub-channel mapped by any one bit of a first bit set is larger than a channel capacity of a sub-channel mapped by any one bit of a second bit set.

In one embodiment, the P2 first-type bits belong to the first bit set, and the P1 second-type bits belong to the second bit set.

In one embodiment, the P2 first-type bits belong to the second bit set, and the P1 second-type bits belong to the first bit set.

In one embodiment, a part of the P2 first-type bits belongs to the first bit set, and another part of the P2 first-type bits belongs to the second bit set.

In one embodiment, the bits in the second bit block are sequentially arranged in the third bit block according to numbers of associated bits in the first bit block.

In one embodiment, all of second-type bits associated with a given first-type bit are arranged prior to the given first-type bit in the third bit block, and the given first-type bit is one of the P2 first-type bits.

In one embodiment, among first-type bits associated with a first target bit and independent of a second target bit, a first bit is arranged foremost in the third bit block. Among first-type bits associated with the second target bit and independent of the first target bit, a second bit is arranged foremost in the third bit block. The first bit is prior to the second bit, and a position of the first target bit in the third bit block is prior to a position of the second target bit in the third bit block. The first target bit and the second target bit are any two of the P1 second-type bits.

In one embodiment, a CRC bit block of the first bit block is used by the first processor 1001 to generate the second bit block.

In one embodiment, the first node is a base station, and the first bit block comprises downlink control information.

In one embodiment, the first node is a UE, and the first bit block comprises uplink control information.

In one embodiment, the first processor 1001 comprises the channel encoder 477 in Embodiment 4.

In one embodiment, the first processor 1001 comprises the channel encoder 457 in Embodiment 4.

In one embodiment, the first processor 1001 comprises at least one of the transmitting processor 416, the channel encoder 477, the controller/processor 475, and the memory 477 in Embodiment 4.

In one embodiment, the first processor 1001 comprises at least one of the transmitting processor 468, the channel encoder 457, the controller/processor 459, the memory 460, and the data source 467 in Embodiment 4.

In one embodiment, the first transmitter 1002 comprises at least one of the antenna 420, the transmitter 418, the transmitting processor 416, the channel encoder 477, the controller/processor 475, and the memory 477 in Embodiment 4.

In one embodiment, the first transmitter 1002 comprises at least one of the antenna 452, the transmitter 454, the transmitting processor 468, the channel encoder 457, the controller/processor 459, the memory 460, and the data source 467 in Embodiment 4.

Embodiment 11

Figure 11:
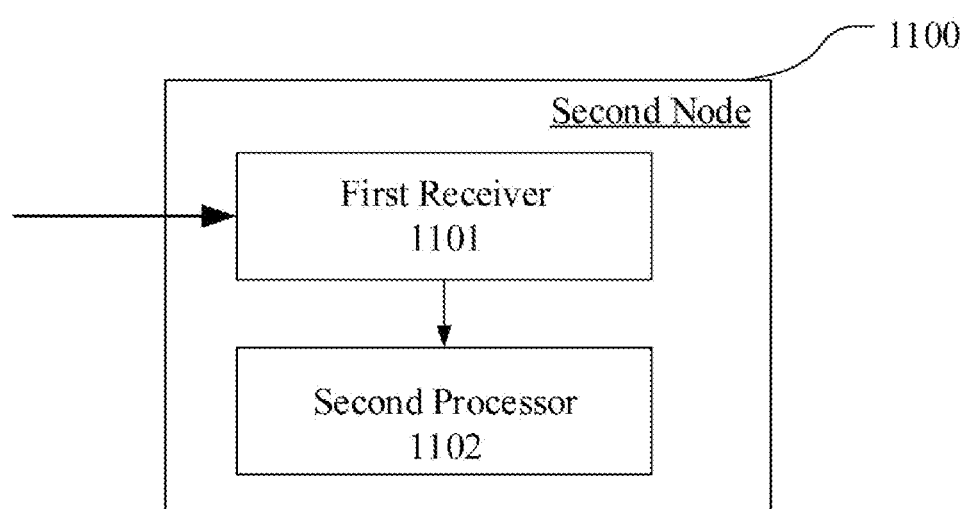
FIG. 11 is a block diagram illustrating the structure of a processing device in a second node for wireless communication according to an embodiment of the disclosure.

Embodiment 11 is a block diagram illustrating the structure of a processing device in a second node for wireless communication, as shown in FIG. 11.

In FIG. 11, the second node device 1100 mainly consists of a first receiver 1101 and a second processor 1102.

The first receiver 1101 receives a first radio signal; the second processor 1102 recovers a first bit block.

In Embodiment 11, bits in the first bit block are used to generate bits in a second bit block, a third bit block comprises the bits in the second bit block and the bits in the first bit block, and the third bit block is used to generate the first radio signal. The first bit block and the second bit block comprise P1 second-type bits and P2 first-type bits, respectively, the third bit block comprise P3 binary bits, and any one of {the P1 second-type bits or the P2 first-type bits} is a binary bit. The P1, the P2 and the P3 are positive integers, respectively. A position of a reference first-type bit in the third bit block is related to the number of bits in the first bit block associated with the reference first-type bit, the reference first-type bit is one of the P2 first-type bits; or a position of a reference second-type bit in the third bit block is related to positions of bits in the second bit block associated with the reference second-type bit in the third bit block, and the reference second-type bit is one of the P1 second-type bits.

In one embodiment, the second processor 1102 further performs channel decoding, wherein the first radio signal is used to generate an input to the channel decoding, channel coding corresponding to the channel decoding is based on a polar code; the third bit block is used as an input to the channel coding; any two bits in the third bit block are mapped onto two different sub-channels, respectively. A channel capacity of a sub-channel mapped by any one bit of a first bit set is larger than a channel capacity of a sub-channel mapped by any one bit of a second bit set.

In one embodiment, the P2 first-type bits belong to the first bit set, and the P1 second-type bits belong to the second bit set.

In one embodiment, the P2 first-type bits belong to the second bit set, and the P1 second-type bits belong to the first bit set.

In one embodiment, a part of the P2 first-type bits belongs to the first bit set, and another part of the P2 first-type bits belongs to the second bit set.

In one embodiment, the bits in the second bit block are sequentially arranged in the third bit block according to numbers of associated bits in the first bit block.

In one embodiment, all of second-type bits associated with a given first-type bit are arranged prior to the given first-type bit in the third bit block, and the given first-type bit is one of the P2 first-type bits.

In one embodiment, among first-type bits associated with a first target bit and independent of a second target bit, a first bit is arranged foremost in the third bit block. Among first-type bits associated with the second target bit and independent of the first target bit, a second bit is arranged foremost in the third bit block. The first bit is prior to the second bit, and a position of the first target bit in the third bit block is prior to a position of the second target bit in the third bit block. The first target bit and the second target bit are any two of the P1 second-type bits.

In one embodiment, a CRC bit block of the first bit block is used to generate the second bit block.

In one embodiment, the second node is a base station, and the first bit block comprises uplink control information.

In one embodiment, the second node is a UE, and the first bit block comprises downlink control information.

In one embodiment, the second processor 1102 determines P3 reference values, and the P3 reference values are respectively corresponding to P3 bits in the third bit block.

In one embodiment, a reference value corresponding to at least one of the P2 first-type bits is used for pruning in the channel decoding.

In one embodiment, a reference value corresponding to at least one of the P2 first-type bits is used to determine whether the first bit block is received correctly.

In one embodiment, the second processor 1102 comprises the channel decoder 478 in Embodiment 4.

In one embodiment, the second processor 1102 comprises the channel decoder 458 in Embodiment 4.

In one embodiment, the second processor 1102 comprises at least one of the receiving processor 470, the channel decoder 478, the controller/processor 475, and the memory 476 in Embodiment 4.

In one embodiment, the second processor 1102 comprises at least one of the receiving processor 456, the channel decoder 458, the controller/processor 459, and the memory 460 in Embodiment 4.

In one embodiment, the first receiver 1101 comprises at least one of the antenna 420, the receiver 418, the receiving processor 470, the channel decoder 478, the controller/processor 475, and the memory 476 in Embodiment 4.

In one embodiment, the first receiver 1101 comprises at least one of the antenna 452, the receiver 454, the receiving processor 456, the channel decoder 458, the controller/processor 459, and the memory 460 in Embodiment 4.

Embodiment 12

Figure 12:
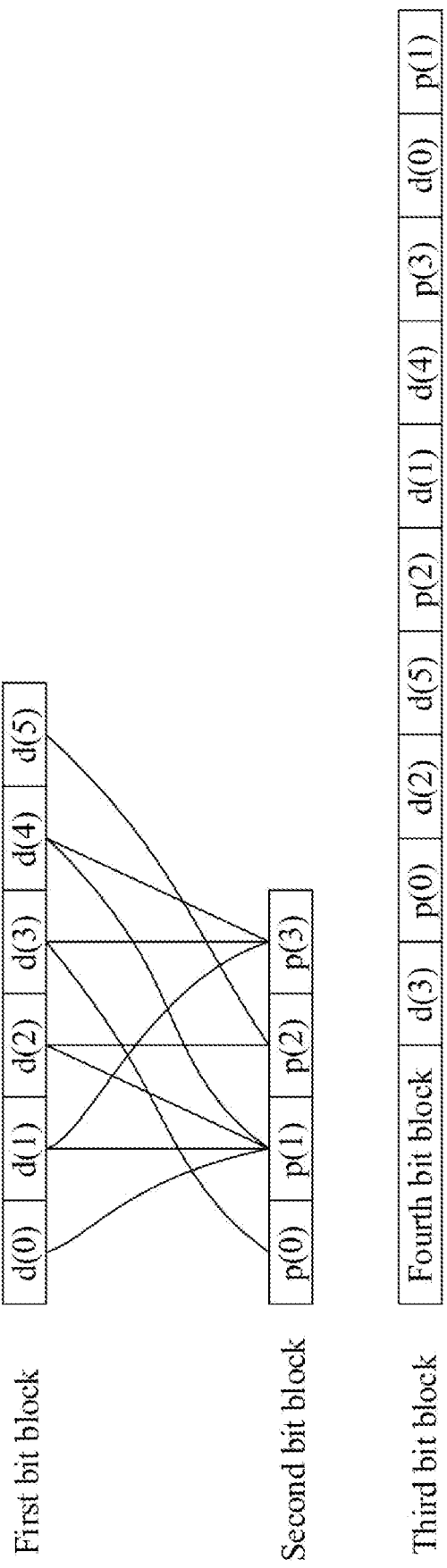
FIG. 12 is a schematic diagram illustrating a mapping relationship between bits in a first bit block, a second bit block, and a third bit block according to still another embodiment of the disclosure.

Embodiment 12 is a schematic diagram illustrating a mapping relationship between bits in a first bit block, a second bit block, and a third bit block, as shown in FIG. 12.

In embodiment 12, the bits in the first bit block are used to generate the bits in the second bit block, and the third bit block comprises the bits in the second bit block and the bits in the first bit block. The first bit block and the second bit block comprise P1 second-type bits and P2 first-type bits, respectively, the third bit block comprise P3 binary bits, any one of {the P1 second-type bits or the P2 first-type bits} is a binary bit, and the P1, the P2 and the P3 are positive integers, respectively. The position of a reference first-type bit in the third bit block is related to the number of bits in the first bit block associated with the reference first-type bit, the reference first-type bit is one of the P2 first-type bits. The P3 is equal to the P1 plus the P2 plus P4, the P4 is the number of bits included in the fourth bit block, and the P4 is a positive integer.

In FIG. 12, the P1 is equal to 6, the P2 is equal to 4, the bits in the first bit block are represented by d(i), and the i is an integer greater than or equal to 0 and less than P1; the bits in the second bit block are represented by p(j), and the j is an integer greater than or equal to 0 and less than P2. Any bit in the first bit block and its associated bit in the second bit block are connected by a solid line.

In Embodiment 12, the bits in the second bit block are sequentially arranged in the third bit block according to the numbers of associated bits in the first bit block. That is, the fewer the associated bits in the first bit block, the higher the position of the corresponding bit in the second bit block in the third bit block. As shown in FIG. 12, the numbers of bits in the first bit block associated with bits p(0), p(1), p(2), and p(3) are 1, 4, 2, 3, respectively. Therefore, {p(0), p(2), p(3), p(1)} are arranged in order from the front to the back in the third bit block.

The ordinary skill in the art may understand that all or part steps in the above method may be implemented by instructing related hardware through a program. The program may be stored in a computer-readable storage medium, for example Read-Only Memory (ROM), hard disk or compact disc, etc. Optionally, all or part steps in the above embodiments also may be implemented by one or more integrated circuits. Correspondingly, each module unit in the above embodiment may be realized in the form of hardware, or in the form of software function modules. The disclosure is not limited to any combination of hardware and software in specific forms. The UE or terminal in the disclosure include but not limited to mobile phones, tablet computers, notebooks, network cards, NB-IOT terminals, eMTC terminals, and other radio communication devices. The base station or system device in the disclosure includes but not limited to macro-cellular base stations, micro-cellular base stations, home base stations, relay base stations, eNB, and other radio communication devices.

The above are merely the preferred embodiments of the disclosure and are not intended to limit the scope of protection of the disclosure. Any modification, equivalent substitute and improvement made within the spirit and principle of the disclosure are intended to be included within the scope of protection of the disclosure.

What is claimed is:

1. A method in a first node for wireless communication, comprising:
    determining a first bit block, the first bit block comprising downlink control information;
    performing channel coding;
    transmitting a first radio signal;
    wherein bits in the first bit block are used to generate bits in a second bit block, a third bit block comprises the bits in the second bit block and the bits in the first bit block; the third bit block is used as an input to the channel coding, an output of the channel coding is used to generate the first radio signal, the channel coding is based on a polar code; the first bit block and the second bit block comprise multiple second-type bits and P2 first-type bits, respectively, the third bit block comprise P3 binary bits, any one of the multiple second-type bits or the P2 first-type bits is a binary bit, the P2 is 24, and the P3 is a positive integer; the second bit block is used for CRC check of the first bit block; the P3 is equal to a sum of a number of bits in the multiple second-type bits and the P2; for an arbitrary bit of the first bit block, the arbitrary bit is used to determine at least one bit in the second bit block; at least two of the multiple second-type bits have front and rear positions in the first bit block opposite to front and rear positions in the third bit block; all of second-type bits associated with a given first-type bit are arranged prior to the given first-type bit in the third bit block, and the given first-type bit is any one bit of the P2 first-type bits; among first-type bits associated with a first target bit and independent of a second target bit, a first bit is arranged foremost in the third bit block, among first-type bits associated with the second target bit and independent of the first target bit, a second bit is arranged foremost in the third bit block; the first bit is prior to the second bit, a position of the first target bit in the third bit block is prior to a position of the second target bit in the third bit block; and the first target bit and the second target bit are any two of the second-type bits; at least two bits of the second bit block are discontinuous in the third bit block, and at least two bits of the first bit block are discontinuous in the third bit block; the first node is a base station.

2. The method according to claim 1, wherein for an arbitrary bit of the second bit block, the arbitrary bit is equal to a sum of a positive integer number of bits in the first bit block modulo 2; or, for an arbitrary bit of the second bit block, the arbitrary bit is obtained by performing XOR operation between a sum of a positive integer number of bits in the first bit block modulo 2 and a corresponding bit in a scrambling sequence, the scrambling sequence is related to an identifier of a target receiver of the first radio signal, and the identifier of the target receiver of the first radio signal is an RNTI.

3. The method according to claim 1, wherein any two bits in the third bit block are mapped onto two different sub-channels, respectively; any two different sub-channels have different channel capacities; a channel capacity of a sub-channel mapped by any one bit of a first bit set is larger than a channel capacity of a sub-channel mapped by any one bit of a second bit set; the first-type bits belong to the first bit set, the second-type bits belong to the second bit set; or, the first-type bits belong to the second bit set, the second-type bits belong to the first bit set; or, a part of the first-type bits belongs to the first bit set, and another part of the first-type bits belongs to the second bit set.

4. The method according to claim 1, wherein a CRC bit block of the first bit block is used to generate the second bit block; the CRC bit block of the first bit block is an output of the first bit block subjected to a CRC cyclic generator polynomial; the polynomial formed by the first bit block and the CRC bit block of the first bit block is divisible by the CRC cyclic generator polynomial on GF(2); that is to say, a remainder obtained by the polynomial formed by the first bit block and the CRC bit block of the first bit block divided by the CRC cycle generator polynomial is zero.

5. The method according to claim 1, wherein the second bit block is used to indicate an identifier of a target receiver of the first radio signal, the identifier of the target receiver of the first radio signal is an RNTI;

or, the first radio signal is an output after the third bit block is sequentially subjected to channel coding, scrambling, a modulation mapper, a layer mapper, precoding, a resource element mapper, and wideband symbol generation.

6. A method in a second node for wireless communication, comprising:

receiving a first radio signal;
performing channel decoding;
recovering a first bit block, the first bit block comprising downlink control information;
wherein bits in the first bit block are used to generate bits in a second bit block, a third bit block comprises the bits in the second bit block and the bits in the first bit block, the third bit block is used to generate the first radio signal; the first radio signal is used to generate an input to the channel decoding, channel coding corresponding to the channel decoding is based on a polar code, the third bit block is used as an input to the channel coding; the first bit block and the second bit block comprise multiple second-type bits and P2 first-type bits, respectively, the third bit block comprise P3 binary bits, any one of the multiple second-type bits or the P2 first-type bits is a binary bit, the P2 is 24, and the P3 is a positive integer; the second bit block is used for CRC check of the first bit block; the P3 is equal to a sum of a number of bits in the multiple second-type bits and the P2; for an arbitrary bit of the first bit block, the arbitrary bit is used to determine at least one bit in the second bit block; at least two of the multiple second-type bits have front and rear positions in the first bit block opposite to front and rear positions in the third bit block; all of second-type bits associated with a given first-type bit are arranged prior to the given first-type bit in the third bit block, and the given first-type bit is any one bit of the P2 first-type bits; among first-type bits associated with a first target bit and independent of a second target bit, a first bit is arranged foremost in the third bit block, among first-type bits associated with the second target bit and independent of the first target bit, a second bit is arranged foremost in the third bit block; the first bit is prior to the second bit, a position of the first target bit in the third bit block is prior to a position of the second target bit in the third bit block; and the first target bit and the second target bit are any two of the second-type bits; at least two bits of the second bit block are discontinuous in the third bit block, and at least two bits of the first bit block are discontinuous in the third bit block; the second node is a UE.

7. The method according to claim 6, wherein a CRC bit block of the first bit block is used to generate the second bit block; the CRC bit block of the first bit block is an output of the first bit block subjected to a CRC cyclic generator polynomial; the polynomial formed by the first bit block and the CRC bit block of the first bit block is divisible by the CRC cyclic generator polynomial on GF(2); that is to say, a remainder obtained by the polynomial formed by the first bit block and the CRC bit block of the first bit block divided by the CRC cycle generator polynomial is zero.

8. The method according to claim 6, wherein any two bits in the third bit block are mapped onto two different sub-channels, respectively; any two different sub-channels have different channel capacities; a channel capacity of a sub-channel mapped by any one bit of a first bit set is larger than a channel capacity of a sub-channel mapped by any one bit of a second bit set; the first-type bits belong to the first bit set, the second-type bits belong to the second bit set; or, the first-type bits belong to the second bit set, the second-type bits belong to the first bit set; or, a part of the first-type bits belongs to the first bit set, and another part of the first-type bits belongs to the second bit set;

or, the first radio signal is an output after the third bit block is sequentially subjected to channel coding, scrambling, a modulation mapper, a layer mapper, precoding, a resource element mapper, and wideband symbol generation;

or, the second bit block is used to indicate an identifier of the second node, the identifier of the second node is an RNTI.

9. The method according to claim 6, wherein for an arbitrary bit of the second bit block, the arbitrary bit is equal to a sum of a positive integer number of bits in the first bit block modulo 2; or, for an arbitrary bit of the second bit block, the arbitrary bit is obtained by performing XOR operation between a sum of a positive integer number of bits in the first bit block modulo 2 and a corresponding bit in a scrambling sequence, the scrambling sequence is related to an identifier of the second node, and the identifier of the second node is an RNTI.

10. The method according to claim 6, wherein the output of the channel decoding is used to recover the first bit block.

11. A device in a first node for wireless communication, comprising:

a first processor, to generate a first bit block and to perform channel coding, the first bit block comprising downlink control information;
a first transmitter, to transmit a first radio signal;
wherein bits in the first bit block are used to generate bits in a second bit block, a third bit block comprises the bits in the second bit block and the bits in the first bit block; the third bit block is used as an input to the channel coding, an output of the channel coding is used to generate the first radio signal, the channel coding is based on a polar code; the first bit block and the second bit block comprise multiple second-type bits and P2 first-type bits, respectively, the third bit block comprise P3 binary bits, any one of the multiple second-type bits or the P2 first-type bits is a binary bit, the P2 is 24, and the P3 is a positive integer; the second bit block is used for CRC check of the first bit block; the P3 is equal to a sum of a number of bits in the multiple second-type bits and the P2; for an arbitrary bit of the first bit block, the arbitrary bit is used to determine at least one bit in the second bit block; at least two of the multiple second-type bits have front and rear positions in the first bit block opposite to front and rear positions in the third bit block; all of second-type bits associated with a given first-type bit are arranged prior to the given first-type bit in the third bit block, and the given first-type bit is any one bit of the P2 first-type bits; among first-type bits associated with a first target bit and independent of a second target bit, a first bit is arranged foremost in the third bit block, among first-type bits associated with the second target bit and independent of the first target bit, a second bit is arranged foremost in the third bit block; the first bit is prior to the second bit, a position of the first target bit in the third bit block is prior to a position of the second target bit in the third bit block; and the first target bit and the second target bit are any two of the second-type bits; at least two bits of the second bit block are discontinuous in the third bit block, and at least two bits of the first bit block are discontinuous in the third bit block; the first node is a base station.

12. The device in the first node according to claim 11, wherein for an arbitrary bit of the second bit block, the arbitrary bit is equal to a sum of a positive integer number of bits in the first bit block modulo 2;
or, for an arbitrary bit of the second bit block, the arbitrary bit is obtained by performing XOR operation between a sum of a positive integer number of bits in the first bit block modulo 2 and a corresponding bit in a scrambling sequence, the scrambling sequence is related to an identifier of a target receiver of the first radio signal, and the identifier of the target receiver of the first radio signal is an RNTI.

13. The device in the first node according to claim 11, wherein any two bits in the third bit block are mapped onto two different sub-channels, respectively; any two different sub-channels have different channel capacities; a channel capacity of a sub-channel mapped by any one bit of a first bit set is larger than a channel capacity of a sub-channel mapped by any one bit of a second bit set; the first-type bits belong to the first bit set, the second-type bits belong to the second bit set; or, the first-type bits belong to the second bit set, the second-type bits belong to the first bit set; or, a part of the first-type bits belongs to the first bit set, and another part of the first-type bits belongs to the second bit set.

14. The device in the first node according to claim 11, wherein a CRC bit block of the first bit block is used to generate the second bit block; the CRC bit block of the first bit block is an output of the first bit block subjected to a CRC cyclic generator polynomial; the polynomial formed by the first bit block and the CRC bit block of the first bit block is divisible by the CRC cyclic generator polynomial on GF(2); that is to say, a remainder obtained by the polynomial formed by the first bit block and the CRC bit block of the first bit block divided by the CRC cycle generator polynomial is zero.

15. The device in the first node according to claim 11, wherein the second bit block is used to indicate an identifier of a target receiver of the first radio signal, the identifier of the target receiver of the first radio signal is an RNTI;
or, the first radio signal is an output after the third bit block is sequentially subjected to channel coding, scrambling, a modulation mapper, a layer mapper, precoding, a resource element mapper, and wideband symbol generation.

16. A device in a second node for wireless communication, comprising:
a first receiver, to receive a first radio signal;
a second processor, to perform channel decoding and to recover a first bit block, the first bit block comprising downlink control information;
wherein bits in the first bit block are used to generate bits in a second bit block, a third bit block comprises the bits in the second bit block and the bits in the first bit block, the third bit block is used to generate the first radio signal; the first radio signal is used to generate an input to the channel decoding, channel coding corresponding to the channel decoding is based on a polar code, the third bit block is used as an input to the channel coding; the first bit block and the second bit block comprise multiple second-type bits and P2 first-type bits, respectively, the third bit block comprise P3 binary bits, any one of the multiple second-type bits or the P2 first-type bits is a binary bit, the P2 is 24, and the P3 is a positive integer; the second bit block is used for CRC check of the first bit block; the P3 is equal to a sum of a number of bits in the multiple second-type bits and the P2; for an arbitrary bit of the first bit block, the arbitrary bit is used to determine at least one bit in the second bit block; at least two of the multiple second-type bits have front and rear positions in the first bit block opposite to front and rear positions in the third bit block; all of second-type bits associated with a given first-type bit are arranged prior to the given first-type bit in the third bit block, and the given first-type bit is any one bit of the P2 first-type bits; among first-type bits associated with a first target bit and independent of a second target bit, a first bit is arranged foremost in the third bit block, among first-type bits associated with the second target bit and independent of the first target bit, a second bit is arranged foremost in the third bit block; the first bit is prior to the second bit, a position of the first target bit in the third bit block is prior to a position of the second target bit in the third bit block; and the first target bit and the second target bit are any two of the second-type bits; at least two bits of the second bit block are discontinuous in the third bit block, and at least two bits of the first bit block are discontinuous in the third bit block; the second node is a UE.

17. The device in the second node according to claim 16, wherein a CRC bit block of the first bit block is used to generate the second bit block; the CRC bit block of the first bit block is an output of the first bit block subjected to a CRC cyclic generator polynomial; the polynomial formed by the first bit block and the CRC bit block of the first bit block is divisible by the CRC cyclic generator polynomial on GF(2); that is to say, a remainder obtained by the polynomial formed by the first bit block and the CRC bit block of the first bit block divided by the CRC cycle generator polynomial is zero.

18. The device in the second node according to claim 16, wherein any two bits in the third bit block are mapped onto two different sub-channels, respectively; any two different sub-channels have different channel capacities; a channel capacity of a sub-channel mapped by any one bit of a first bit set is larger than a channel capacity of a sub-channel mapped by any one bit of a second bit set; the first-type bits belong to the first bit set, the second-type bits belong to the second bit set; or, the first-type bits belong to the second bit set, the second-type bits belong to the first bit set; or, a part of the first-type bits belongs to the first bit set, and another part of the first-type bits belongs to the second bit set;

or, the second bit block is used to indicate an identifier of the second node, the identifier of the second node is an RNTI;

or, the first radio signal is an output after the third bit block is sequentially subjected to channel coding, scrambling, a modulation mapper, a layer mapper, precoding, a resource element mapper, and wideband symbol generation.

19. The device in the second node according to claim 16, wherein for an arbitrary bit of the second bit block, the arbitrary bit is equal to a sum of a positive integer number of bits in the first bit block modulo 2;

or, for an arbitrary bit of the second bit block, the arbitrary bit is obtained by performing XOR operation between a sum of a positive integer number of bits in the first bit block modulo 2 and a corresponding bit in a scrambling sequence, the scrambling sequence is related to an identifier of the second node, and the identifier of the second node is an RNTI.

20. The device in the second node according to claim 16, wherein the output of the channel decoding is used to recover the first bit block.

\* \* \* \* \*